(12) United States Patent
Williams et al.

(10) Patent No.: US 7,964,280 B2
(45) Date of Patent: Jun. 21, 2011

(54) HIGH COLOUR DIAMOND LAYER

(76) Inventors: Stephen David Williams, Worcester (GB); Daniel James Twitchen, Berkshire (GB); Philip Maurice Martineau, Berkshire (GB); Geoffrey Alan Scarsbrook, Berkshire (GB); Ian Friel, Guildford (GB)

( * ) Notice: Subject to any disclaimer, the term of this patent is extended or adjusted under 35 U.S.C. 154(b) by 679 days.

(21) Appl. No.: 11/917,908

(22) PCT Filed: Jun. 22, 2006

(86) PCT No.: PCT/IB2006/001694
§ 371 (c)(1),
(2), (4) Date: Dec. 18, 2007

(87) PCT Pub. No.: WO2006/136929
PCT Pub. Date: Dec. 28, 2006

(65) Prior Publication Data
US 2010/0015438 A1    Jan. 21, 2010

Related U.S. Application Data

(60) Provisional application No. 60/699,374, filed on Jul. 15, 2005.

(30) Foreign Application Priority Data

Jun. 22, 2005 (GB) ................................ 0512728.7

(51) Int. Cl.
*C30B 25/10* (2006.01)
*C23C 16/27* (2006.01)

(52) U.S. Cl. .............. 428/408; 117/68; 117/93; 117/92; 117/929; 427/577

(58) Field of Classification Search ............... 117/68, 117/93, 94, 929; 427/577; 428/408; 423/446
See application file for complete search history.

(56) References Cited

U.S. PATENT DOCUMENTS

| | | | | |
|---|---|---|---|---|
| 5,391,409 A | * | 2/1995 | Shibata et al. | 427/577 |
| 5,443,032 A | * | 8/1995 | Vichr et al. | 117/929 |
| 5,474,021 A | * | 12/1995 | Tsuno et al. | 117/94 |
| 5,474,816 A | * | 12/1995 | Falabella | 427/577 |
| 5,635,258 A | * | 6/1997 | Chen et al. | 427/577 |
| 5,908,503 A | * | 6/1999 | Sumiya et al. | 423/446 |

(Continued)

FOREIGN PATENT DOCUMENTS

EP    0 316 856 A1    5/1989

(Continued)

OTHER PUBLICATIONS

Eaton, et al., "Co-doping of Diamond with Boron and Sulfur", Electrochemical and Solid-State Letters, vol. 5, No. 8, pp. G65-G68, 2002.

(Continued)

*Primary Examiner* — Archene Turner
(74) *Attorney, Agent, or Firm* — Oblon, Spivak, McClelland, Maier & Neustadt, L.L.P.

(57) ABSTRACT

A method of producing CVD diamond having a high color, which is suitable for optical applications, for example. The method includes adding a gaseous source comprising a second impurity atom type to counter the detrimental effect on colour caused by the presence in the CVD synthesis atmosphere of a first impurity atom type. The described method applies to the production of both single crystal diamond and polycrystalline diamond.

28 Claims, 3 Drawing Sheets

U.S. PATENT DOCUMENTS

Figure 1:
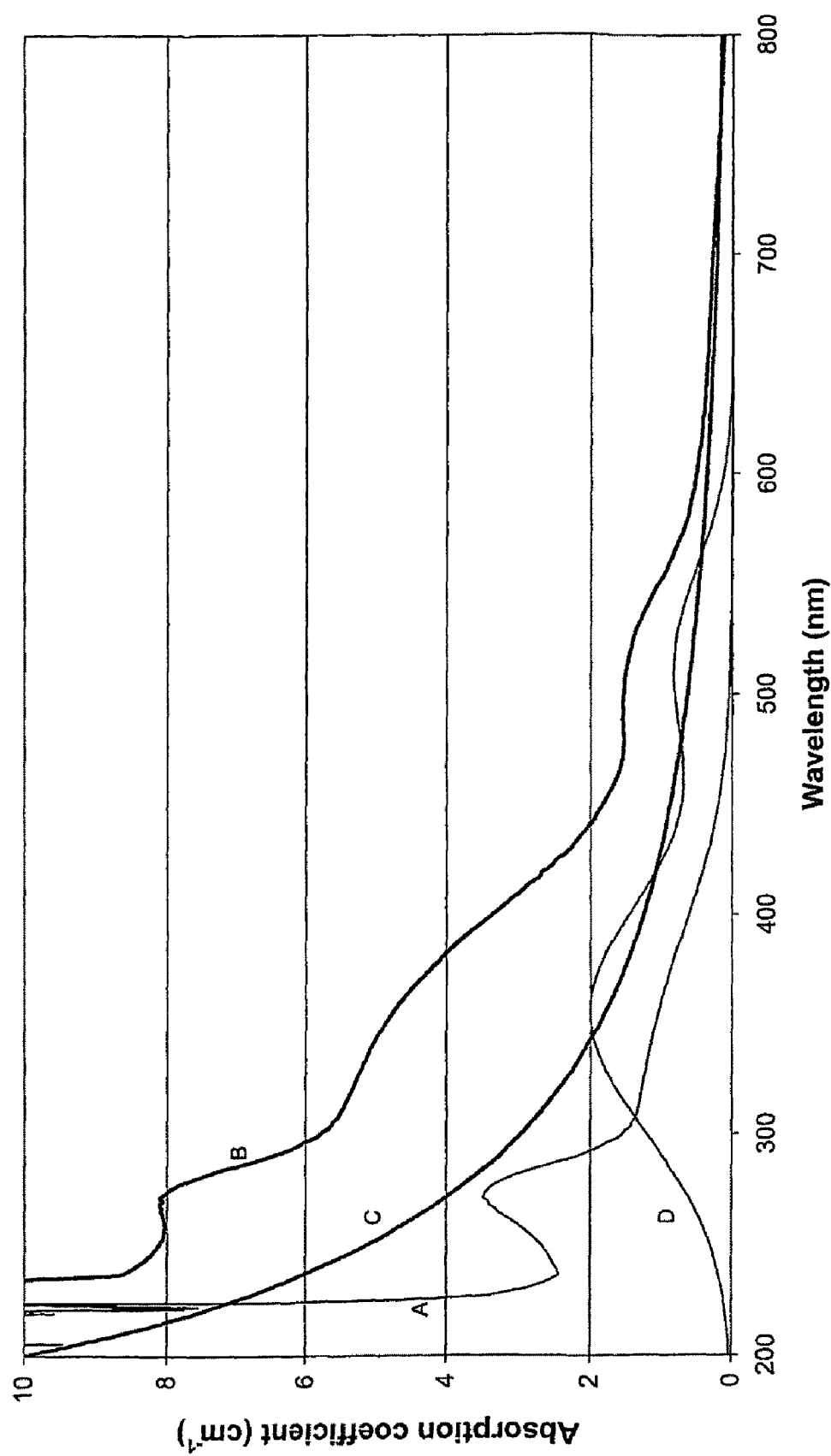

| | | | |
|---|---|---|---|
| 6,096,129 A * | 8/2000 | Saito et al. ............. | 117/93 |
| 6,582,513 B1 * | 6/2003 | Linares et al. ............. | 423/446 |
| 6,833,027 B2 * | 12/2004 | Butler et al. ............. | 117/94 |
| 7,128,974 B2 * | 10/2006 | Scarsbrook et al. ............. | 428/408 |
| 7,160,617 B2 * | 1/2007 | Scarsbrook et al. ............. | 428/408 |
| 7,172,655 B2 * | 2/2007 | Twitchen et al. ............. | 423/446 |
| 2003/0131787 A1 | 7/2003 | Linares et al. | |
| 2004/0180205 A1 | 9/2004 | Scarsbrook et al. | |
| 2004/0194690 A1 * | 10/2004 | Twitchen et al. ............. | 117/68 |

FOREIGN PATENT DOCUMENTS

| | | |
|---|---|---|
| EP | 0 507 497 A1 | 10/1992 |
| EP | 0 589 464 A1 | 3/1994 |
| EP | 0 615 954 A1 | 9/1994 |
| EP | 0 715 885 A2 | 6/1996 |
| EP | 1 752 566 A1 | 2/2007 |
| JP | 1-131014 | 5/1989 |
| JP | 6-107494 | 4/1994 |
| JP | 6-263418 | 9/1994 |
| JP | 7-277890 | 10/1995 |
| JP | 9-165295 | 6/1997 |
| JP | 11-1392 | 1/1999 |
| JP | 2005-132653 | 5/2005 |
| WO | 03 052177 | 6/2003 |
| WO | 2005 061400 | 7/2005 |
| WO | WO 2005/116306 A1 | 12/2005 |

OTHER PUBLICATIONS

Eaton, et al, "Diamond growth in the presence of boron and sulfur", Diamond and Related Materials, vol. 12, No. 10-11, pp. 1627-1632, 2003.

Cao, et al., "Homoepitaxial diamond films codoped with phosphorus and nitrogen by chemical-vapor deposition", Journal of Applied Physics, vol. 78, No. 5, pp. 3125-3128, 1995.

Musale, et al., "Roman, photoluminescence and morphological studies of Si- and N-doped diamond films grown on Si (100) substrate by hot-filament chemical vapor deposition technique", Diamond and Related Materials . vol. 11, No. 1, pp. 75-86, 2002.

Hu, et al., "Electrical and structural properties of boron and phosphorus co-doped diamond films", Carbon, vol. 42, No. 8-9, pp. 1501-11506, 2004.

P. Kania, et al., Diamond and Related Materials, vol. 4, pp. 425-428 (1995).

J. Michler, et al., J. Appl. Phys., vol. 83, No. 1, pp. 187-197 (1998).

R. Locher, et al., Appl. Phys. Lett., vol. 65, No. 1, pp. 34-36 (1994).

I.I. Vlasov, et al., Phys. Stat. Sol, vol. (a)181, No. 83, pp. 83-90 (2000).

P.E. Pehrsson, et al., Mat. Res. Soc. Symp, Proc., vol. 416, pp. 51-56 (1996).

U.S. Appl. No. 12/245,002, filed Oct. 3, 2008, Scarsbrook, et al.

Qi Liang, et al., "Effect of Nitrogen Addition on the Morphology and Structure of Boron-doped Nanostructured Diamond Films", Applied Physics Letters, vol. 83, No. 24, Dec. 15, 2003, pp. 5047-5049.

T. Hsu, et al., "Electron Field Emission of Nanocrystalline Diamond Films Co-doped with Boron and Nitrogen", 2001 Proceedings of 14th International Vacuum Microelectronics Conference, pp. 273-274.

I-Nan Lin, et al. "Improvement on Electron Field Emission Properties of Nanocrystalline Diamond Films by Co-doping of Boron and Nitrogen", J. Vac. Sci. Technol. B 21 (3), May/Jun. 2003, pp. 1074-1079.

Ichizo Yagi, et al., "The Effects of Nitrogen and Plasma Power on Electrochemical Properties of Boron-Doped Diamond Electrodes Grown by MPCVD", Journal of the Electrochemical Society, 149 (1), 2002, pp. E1-E5.

\* cited by examiner

HIGH COLOUR DIAMOND LAYER

CROSS-REFERENCE TO RELATED APPLICATIONS

The present application is a 35 U.S.C. §371 National Stage patent application of International patent application PCT/IB06/001694, filed on Jun. 22, 2006, which claims priority to U.S. provisional patent application 60/699,374, filed on Jul. 15, 2005, and United Kingdom patent application GB 0512728.7, filed on Jun. 22, 2005.

BACKGROUND OF THE INVENTION

This invention relates to CVD diamond of high colour suitable for optical applications including gemstones of high colour grade. In particular, the present invention relates to a method of adding a gaseous source comprising a second impurity atom type to counter the detrimental effect on colour caused by the presence in the CVD synthesis atmosphere of a first impurity atom type.

The described method applies to the production of both single crystal diamond and polycrystalline diamond, particularly to single crystal diamond.

All documents referred to herein are hereby incorporated by reference.

Methods of depositing material such as diamond on a substrate by CVD are now well established and have been described extensively in patent and other literature. Where diamond is being deposited on a substrate, the method generally involves providing a gas mixture which, on dissociation, can provide hydrogen or a halogen (e.g. F, Cl) in atomic form and C or carbon-containing radicals and other reactive species, e.g. $CH_x$, $CF_x$ wherein x can be 1 to 4. In addition, oxygen containing sources may be present, as may sources for nitrogen and for boron. Nitrogen can be introduced in the synthesis plasma in many forms, such as $N_2$, $NH_3$, air and $N_2H_4$, for example. In many processes inert gases such as helium, neon or argon are also present. Thus, a typical source gas mixture will contain hydrocarbons $C_xH_y$, wherein x and y can each be 1 to 10, or halocarbons $C_xH_yHal_z$, wherein x and z can each be 1 to 10 and y can be 0 to 10, and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled. For example, hydrogen may be present as deuterium or tritium and carbon may be present as $^{12}C$ or $^{13}C$.

Dissociation of the source gas mixture is brought about by an energy source such as microwaves, RF (radio frequency) energy, a flame, a hot filament or jet based technique and the reactive gas species so produced are allowed to deposit onto a substrate and form diamond.

Single crystal CVD diamond has a range of applications including electronic devices and highly engineered optical devices. The properties of the diamond can be tailored specifically for each application, and in so doing limitations are placed on the details of the synthesis process and the cost of producing the material. International application WO 01/96634 describes the synthesis of high purity diamond suitable for electronic applications, which because of the low levels of impurity in the gas phase of the deposition process and subsequently in the solid also show low absorption and are suitable for the production of "high colour" diamond (that is, material with absorption close to the theoretical limit for impurity free diamond, and thus typically providing colours equivalent to the natural diamond colour grades of D to better than K, where these are colour grades on the Gemological Institute of America (GIA) colour scale, see 'Diamond Grading ABC', V. Pagel-Theisen, 9th Edition, 2001, page 61). However, there are economic penalties in providing the degree of control necessary to achieve the low levels of nitrogen used in the method of that invention.

The colour scale of the Gemological Institute of America (GIA), which is the most widely used and understood diamond colour scale, is shown in Table 1. Table 1 is derived from 'Diamond Grading ABC, The Manual', Verena Pagel-Theisen, $9^{th}$ Edition 2001, published by Rubin and Son n.v. Antwerp, Belgium, page 61. The colours are determined by comparison with standards. The determination of the colour of diamonds is a subjective process and can only reliably be undertaken by persons skilled in the art.

TABLE 1

| Colour on GIA Scale | Impression of Colour |
|---|---|
| D | Colourless |
| E | |
| F* | |
| G | Almost |
| H | colourless |
| I | |
| J | |
| K | |
| L | Pale yellowish |
| M | |
| N | Very light |
| O | yellowish |
| P | Light yellow |
| Q | |
| R | Yellowish |
| S | |
| T | |
| U | |
| V | |
| W | |
| X | |
| Y | |
| Z | |
| Z+ | Fancy Colours |

*colourless for round brilliants less than 0.47 cts.

The clarity scale of the Gemological Institute of America (GIA), which is the most widely used clarity scale, is shown in Table 2. Table 2 is derived from 'Diamond Grading ABC, The Manual', Verena Pagel-Theisen, $9^{th}$ Edition 2001, published by Rubin and Son n.v. Antwerp, Belgium, page 61. It takes into account both internal and external flaws on a cut diamond. Typically, examination is made with the aid of a 10× magnifier or loupe by an experienced grader with appropriate illumination for the type of defect that is being sought.

TABLE 2

| Description | Designation | Notes |
|---|---|---|
| Flawless | FL | Flawless: No internal or external features, with the exception of extra facets that are not visible from the upper facet; naturals at the girdle which neither widen it nor make it irregular; non-reflecting internal growth lines which are neither coloured nor white and do not affect transparency. |
| Internally flawless | IF | Loupe Clean (internally flawless): no inclusions and only minor external features, with the exception of small external growth lines. |
| Very very slightly | VVS 1 & 2 | Very, very small inclusions 1 & 2: very small inclusions which are difficult to see; in the case |

TABLE 2-continued

| Description | Designation | Notes |
|---|---|---|
| included | | of VVS1, these are very difficult to see and then only from the lower facet or they are so small and sufficiently near the surface to be easily cut away (potentially flawless). In the case of VVS2, the inclusions are still very difficult to see. Typical inclusions include occasional spots, diffuse, very fine clouds, slight beading on the girdle, internal growth lines and very small fissures, nicks or blow indentations. |
| Very slightly included | VS 1 & 2 | Very small inclusions 1 & 2: smaller inclusions ranging from those which are difficult to see to those which are somewhat easier to see. Typical inclusions are small included crystals and small fissures, more distinct small clouds and groups of dot-like inclusions. |
| Slightly included | SI 1 & 2 | Small inclusions 1 & 2: inclusions which are easy (SI1) or very easy (SI2) to see; the inclusions are often in a central position, can be recognised immediately and in some cases are also visible to the naked eye. |
| Imperfect | I 1 to 3 | Inclusions 1, Inclusions 2 and Inclusions 3: distinct inclusions which in most cases are easily visible to the naked eye through the crown; in the case of inclusions 3, stone durability can be endangered. Typical inclusions are large included crystals and cracks. |

By "high clarity" is meant herein a clarity of at least SI 1 as defined in Table 2, preferably at least VS 2.

The GIA diamond gem grading system is the most widely used grading scale for diamond gems and generally considered the definitive grading scale. For the purposes of this application all gem colour grades are based on the GIA colour grades, and other gem properties such as clarity are likewise based on the GIA grading system. For a given quality of diamond, i.e. material with given absorption characteristics, the colour of a gem also varies with the size and cut of gem produced, moving to poorer colours (to colours towards Z in the alphabet) as the stone gets larger. To enable the colour system to be applied as a material property it is thus necessary to further fix the size and type of cut of the gemstone. All GIA colour grades given in this specification are for a standardised 0.5 ct round brilliant cut unless otherwise stated.

In contrast to growing high purity layers with high colour, synthesis of coloured gemstones, in which deliberate controlled levels of impurities are added to the process, is reported in WO 03/052177 and WO 03/052174. These techniques provide a method for producing CVD diamond layers and CVD diamond gemstones of a range of colours, typically in the blue or brown part of the spectrum.

Nitrogen is a significant impurity in CVD diamond processes. The extent to which it plays a key role in determining the colour and quality of the material is emphasised in the earlier mentioned prior art. Nitrogen is very prevalent, forming the majority of the atmosphere, and commonly being the major contaminant of gas supplies, even those specified as 'high purity'. It is expensive to remove nitrogen from high purity gas supplies to the levels necessary for synthesis of high colour diamond using the method described in WO 01/96634, which impacts on the cost of the final material, and it is desirable to identify alternative synthesis methods more tolerant of impurities, which are suitable for the production of the thick layers of high colour necessary for the production of gemstones and other selected optical devices.

Diamond containing nitrogen in the form of single substitution nitrogen, present in sufficient concentration to give observable spectroscopic features, is called Ib diamond. The spectroscopic features include an absorption coefficient maximum at 270 nm and, to longer wavelengths, a gradual decrease in absorption coefficient between approximately 300 nm and 500 nm, with signs of a broad absorption band at approximately 365 nm. These features can be seen in absorption spectra of a type Ib high pressure high temperature diamond such as spectrum A in FIG. 1.

Although the effect of single substitutional nitrogen on the absorption spectrum is greatest in the ultra-violet, it is the weaker absorption that extends into the visible region of the spectrum that affects the colour of the type Ib diamond and gives it a characteristic yellow/brown colour.

The UV/visible absorption spectrum of homoepitaxial CVD diamond grown in the presence of nitrogen typically contains a contribution from single substitutional nitrogen with the spectral characteristics described above. In addition to single substitutional nitrogen, homoepitaxial CVD diamond grown in the presence of nitrogen typically contains some nitrogen in the form of nitrogen vacancy centres. When the N-V centre is electrically neutral $[N-V]^0$ it gives rise to absorption with a zero phonon line at 575 nm. When the N-V centre is negatively charged $[N-V]^-$ it gives rise to absorption with a zero-phonon line at 637 nm and an associated system of phonon bands with an absorption maximum at approximately 570 nm. At room temperature the absorption bands of these two charge states of the N-V centre merge into a broad band from about 500 nm-640 nm. This absorption band is in the yellow part of the visible spectrum, and when it is strong the crystals can exhibit a complementary pink/purple colour.

The UV/visible absorption spectra of low quality homoepitaxial CVD diamond grown in the presence of nitrogen, may also show a gradual rise in measured absorption from the red to the blue region of the spectrum and into the ultra-violet. There may also be contributions from scattering. The spectra generally contain no other features, apart from those related to single substitutional nitrogen. This absorption spectrum gives an undesirable brown colour and such diamond often contains clearly visible graphitic inclusions.

The absorption spectrum of higher quality homoepitaxial CVD diamond grown in the presence of nitrogen contains additional contributions that are not present in natural, HPHT synthetic diamond or low quality CVD diamond. These include two broad bands centered at approximately 350 nm and 510 nm.

The band at approximately 350 nm is distinct from the broad feature in that region of the spectrum of ordinary type Ib spectrum and distorts the spectrum of ordinary type Ib diamond to an extent dependent on the concentration of the centre responsible relative to the single substitutional nitrogen.

Similarly the band centered at approximately 510 nm can overlap absorption relating to negative nitrogen-vacancy centres and the visible absorption relating to single substitutional nitrogen.

The overlapping of the various contributions to the absorption spectra can cause the bands at approximately 350 and 510 nm to give rise to broad shoulders in the absorption spectrum rather than distinct maxima. These contributions to absorption do however have a very significant effect on the relative absorption coefficients of the diamond at wavelengths in the spectral region between 400 and 600 nm where the eye is very sensitive to small differences. They therefore make an important contribution to the perceived colour of the diamond.

The width and position in the spectrum of these bands can vary. The position of peak maxima is most easily ascertained by using the second differential of the spectrum. It has been found that absorption spectra for homoepitaxial CVD diamond grown in the presence of nitrogen, and in the absence of any second impurity used according to the current invention, can generally be deconstructed into the following approximate components.

1) Single substitutional nitrogen component with an absorption coefficient at 270 nm that is generally within the range 0.4 m$^{-1}$ and 10 m$^{-1}$ and an absorption coefficient at 425 nm that generally lies between 0.04 m$^{-1}$ and 1 m$^{-1}$.
2) An absorption band centered at 3.54 eve (350 nm)+/−0.2 eve with a FWHM of approximately 1 eve and a maximum contribution to the absorption spectrum generally between 1 and 8 m$^{-1}$ at its centre.
3) An absorption band centered at 2.43 eve (510 nm)+/−0.4 eve with a FWHM of approximately 1 eve and a maximum contribution to the absorption spectrum generally between 0.2 and 4 m$^{-1}$ at its centre.
4) A small residual wavelength dependent component of the measured absorption coefficient (in m$^{-1}$) that is found to have a wavelength dependence of the following approximate form: c x (wavelength in microns)$^{-3}$ where c<0.2 such that the contribution of this component at 510 nm is generally less than 1.5 m$^{-1}$.

FIG. 1 shows the absorption spectrum of a brown CVD diamond layer (curve B) and the components into which it can be decomposed. The first step in such a spectral decomposition is the subtraction of the spectrum of a type Ib HPHT synthetic diamond (curve A), scaled so that the residual shows no 270 nm feature. The residual spectrum can then be decomposed into a c×λ$^{-3}$ component (curve C) and two overlapping bands of the kind described above (curve D).

It has been found that the form of UV/visible spectra of CVD diamond grown using a range of different processes can be well specified by sums of the components described above, with different weighting factors for the components in different cases. For the purposes of specifying the shape of the spectrum the contributions of the different components are given in the following ways.

270 nm: The peak 270 nm absorption coefficient of the type Ib component is measured from a sloping baseline connecting the type Ib spectrum either side of the 270 nm feature that extends over the approximate range 235 nm-325 nm.

350 nm band: The peak absorption coefficient contribution of this band.

510 nm band: The peak absorption coefficient contribution of this band.

Ramp: The contribution of the c×λ$^{-3}$ component to the absorption coefficient at 510 nm.

Figure 2:
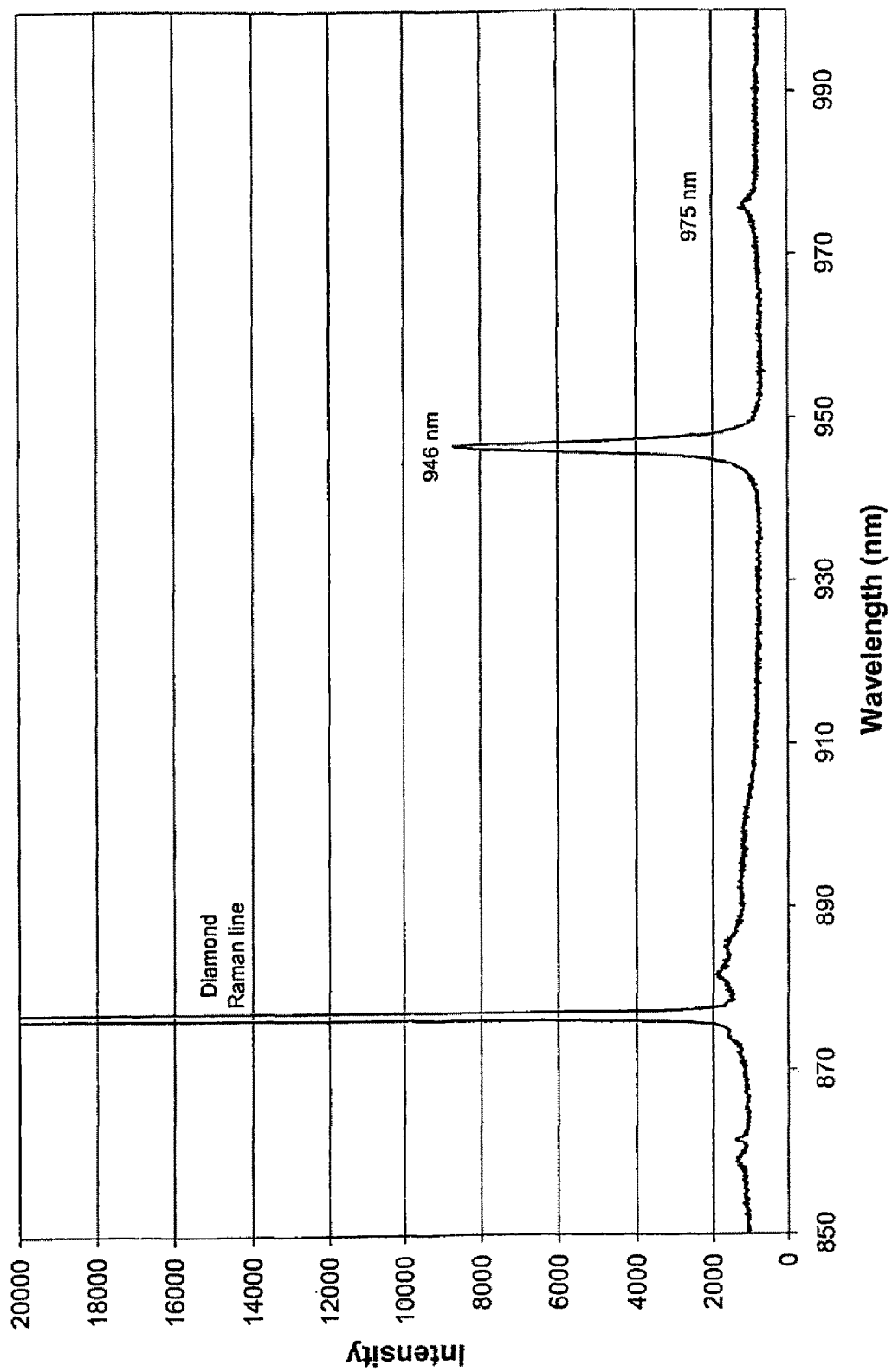
Figure 3:
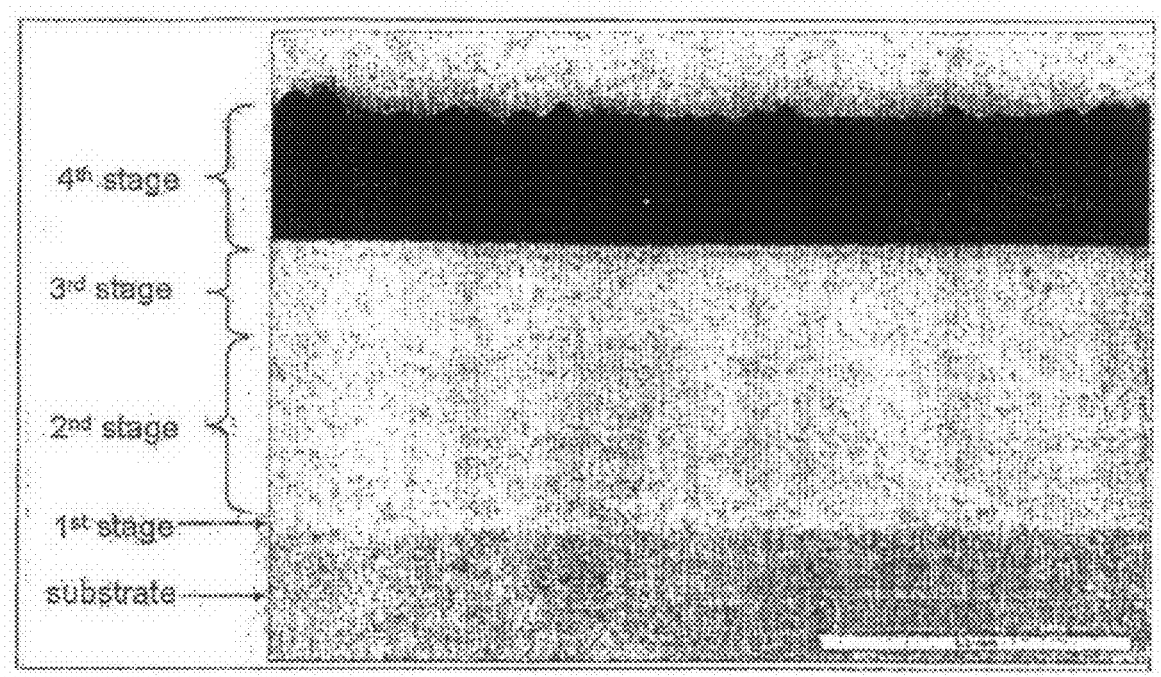

The present invention is hereby described with reference to the following figures in which:

FIG. 1 shows the spectral decomposition of UV/visible absorption spectrum of an orangish brown CVD diamond layer, representing a typical CVD diamond layer grown in the presence of nitrogen without applying the method of this invention. Spectrum A shows a type Ib HPHT synthetic diamond, spectrum B shows an original spectrum of orangish brown CVD diamond, spectrum C shows a spectral component with (wavelength)$^{-3}$ dependence, and spectrum D shows a spectral component composed of two broad absorption bands;

FIG. 2 shows a photoluminescence spectrum of a silicon doped CVD diamond sample recorded at 77 K with 785 nm laser excitation; and FIG. 3 shows a low magnification optical microscopy image of a sample described in Example 7.

DETAILED DESCRIPTION OF THE INVENTION

In a first embodiment, the present invention provides a method of producing a CVD diamond layer having high colour comprising:
 (i) providing a substrate;
 (ii) providing a CVD synthesis atmosphere in which there exists a first gas comprising a first impurity atom type which has a detrimental effect on the colour of the produced diamond layer; and
 (iii) adding into the synthesis atmosphere a second gas comprising a second impurity atom type,
  wherein the first and second impurity atom types are different; the type and quantity of the second impurity atom type is selected to reduce the detrimental effect on the colour caused by the first impurity atom type so as to produce a diamond layer having high colour; and the first and second impurity atom types are independently nitrogen or atoms which are solid in the elemental state at room temperature and pressure.

In this way, the method of the present invention is able to provide a CVD diamond layer having high colour where the synthesis atmosphere comprises a gas having a first impurity atom type that would prevent high colour diamond from being produced. For example, the presence of a gas in the synthesis atmosphere comprising nitrogen would typically cause the synthesised diamond to have a yellow/brown colour, whereas the presence of a gas in the synthesis atmosphere comprising boron would typically cause the synthesised diamond to have a blue colour.

The term "high colour" is defined in this invention in two different ways depending upon the form of the diamond material and the application to which it is put. The definition of "high colour" used herein is that which is most applicable to the form of the diamond layer produced and its application. When the diamond is in the form of a round brilliant (i.e. when the diamond is in the form of a gem stone), the GIA colour scale is generally used. When the diamond is in the form of a plate, etc, to be used in a technological application, the material is generally defined in terms of its absorption characteristics. Absorption characteristics are also used to define polycrystalline diamond.

Thus, when the diamond layer of the invention is in the form of a gem stone, 'High colour' is generally defined as being colour better than K on the Gemological Institute of America (GIA) gem diamond colour scale (described above) as determined for a 0.5 ct round brilliant. Such colour grades are perceived by a skilled diamond grader as being nearly colourless or colourless. The diamond may have colour better than J, preferably better than 1, preferably better than H, preferably better than G, preferably better than F, or preferably better than E. The diamond layer of the invention has "very high colour" where the colour is D to F on the GIA gem diamond colour scale as determined for a 0.5 ct round brilliant.

For technological applications and for polycrystalline diamond layers of the present invention, "high colour" is generally defined as the majority volume of the material having at least one of the following absorption coefficients at the following specific wavelengths in the near ultraviolet and visible part of the electromagnetic spectrum (that is wavelengths in the range approximately 270 nm to 800 nm) when measured at room temperature:
 (i) at 270 nm, is less than 2.9 cm$^{-1}$, preferably less than 1.9 cm$^{-1}$, preferably less than 1.0 cm$^{-1}$, preferably less than 0.40 cm$^{-1}$;

(ii) at 350 nm, is less than 1.5 cm$^{-1}$, preferably less than 0.90 cm$^{-1}$, preferably less than 0.50 cm$^{-1}$, preferably less than 0.20 cm$^{-1}$;

(iii) at 520 nm, is less than 0.45 cm$^{-1}$, preferably less than 0.30 cm$^{-1}$, preferably less than 0.14 cm$^{-1}$, preferably less than 0.06 cm$^{-1}$; and (iv) at 700 nm, is less than 0.18 cm$^{-1}$, preferably less than 0.12 cm$^{-1}$, preferably less than 0.06 cm$^{-1}$, preferably less than 0.03 cm$^{-1}$.

Material of the invention can have sharp absorption features in the range 720-750 nm, but these contribute little to the colour and are thus not restricted by these definitions.

To derive the absorption coefficient the reflection loss must first be subtracted from the measured absorbance spectrum. When subtracting the reflection loss, it is important to take account of the spectral dependence of the reflection coefficient. This can be derived from the wavelength dependence of the refractive index of diamond given by F. Peter in Z. Phys. 15, 358-368 (1923). Using this and standard formulae for the dependence of reflection loss for a parallel-sided plate on the refractive index, the effect of reflection losses on the apparent absorbance can be calculated as a function of wavelength and subtracted from measured spectra to allow absorption coefficient spectra to be calculated more accurately.

Alternatively, "high colour" may be defined using the CIELAB colour system as outlined later in this specification. This colour modelling system allows colour grades to be determined from absorption spectra.

As used herein, the term "majority volume" means at least 50% of the diamond layer, preferably at least 55%, preferably at least 60%, preferably at least 70%, preferably at least 80%, preferably at least 90%, preferably at least 95% of the diamond layer.

The second gas is deliberately added to the CVD diamond synthesis atmosphere. Preferably, the second gas is added in a controlled manner. The presence of the second gas may be controlled such that the concentration of the second gas is stable to better than 20%, preferably better than 10%, preferably better than 3%.

Without being bound by any particular theory, it is believed that the second impurity atom type suppresses the roughening effect that the first impurity atom type otherwise has on the growth surface. By keeping the growth surface smooth the uptake of a wide range of defects is suppressed which otherwise degrade the colour. Addition of a gaseous source comprising an impurity atom type (such as nitrogen) to a single crystal CVD diamond synthesis process, can change the reactions occurring on the diamond growth surface in such a way that the roughness of the surface is increased, giving the surface a greater propensity for incorporation of defects. This is particularly the case when an impurity catalyses the nucleation of new layers of diamond in different regions of a {100} surface, leading to the formation of macrosteps consisting of terraces with inclined risers that offer different kinds of sites for defect incorporation, such as is described in Martineau et al., Gems & Gemology, 40(1), 2 (2004).

There are many kinds of defects that may potentially be involved. For example, single substitutional impurity defects may be incorporated. These involve the substitution of a carbon atom by an impurity atom. Hydrogen is always present in the CVD growth environment and may become incorporated either on its own or in combination with one or more impurity atoms. Vacancies (unoccupied sites in the diamond lattice which would normally be occupied by a carbon atom) may become incorporated in combination with one or more neighbouring impurity atoms (e.g. nitrogen-vacancy defects), or one or more hydrogen atoms (e.g. vacancy-hydrogen complexes). Some defect complexes involve impurity atoms, hydrogen atoms and vacancies (e.g. nitrogen-vacancy-hydrogen complexes). Clusters of vacancies may be formed with or without bonded hydrogen and in some cases may be associated with impurity atoms.

The wide ranging set of defects incorporated once the surface is roughened is generally found to have an undesirable effect on the optical and electronic properties of the material. For example, the set of defects may contain some which give the material undesirable optical properties because of the way they absorb light in, for example, the visible region of the spectrum. They will degrade electronic properties because they reduce the mobility and lifetime of carriers.

One general mechanism that is believed to underlie the current invention is that the deleterious effect of one gaseous source comprising a first impurity atom type can be suppressed by the addition of a second gaseous source comprising a second impurity atom type which suppresses the roughening effect that the first impurity atom type would otherwise have on the growth surface. By suppressing the roughening of the surface the addition of the second impurity also suppresses the incorporation of the wide range of defects outlined above that degrade the properties of the material grown.

In the presence of both impurity atom types, with growth taking place on a smooth surface, the two impurity atom types will generally be incorporated but with a lower efficiency than would be observed for growth on a rough surface. It is significant, however, that many of the defects discussed above (e.g. vacancy clusters and hydrogen-related defects) are not observed at all when growth has taken place on a smooth surface as a result of the addition of the second impurity atom type. The outcome is that the two impurity atom types may be incorporated into the diamond material at moderate concentrations that are measurable but without the wide range of defects that have the strongest adverse effects on the properties of the diamond layer produced, such as its optical transmission.

It is also believed that the method of the present invention may additionally be based on a second general principle in which the two impurity atom types are incorporated in such a way that they mutually compensate each other. As such, the two impurity atom types are chosen so that, within particular concentration ranges in the diamond layer, they do not have a substantial adverse effect on the material properties that are desired. According to prior teaching in the art, there would be an assumption that this would exclude any benefit from compensation using nitrogen, which is normally associated with a range of defects that degrades the colour and other properties. However, in light of the first general principle outlined above that defects can be decreased on addition of a second impurity atom type, additional advantage can be taken of the mutual compensation effect between the two impurity atom types. This will generally be partly because one impurity atom type compensates for the effect that the other would have in its absence and vice-versa. Compensation can be illustrated using the example of nitrogen and boron. By themselves substitutional nitrogen and boron give diamond yellow/brown and blue colour, respectively. However, the inventors of the present application have found that when present together in approximately the same concentrations, colourless material can result because the substitutional nitrogen defects donate electrons to the substitutional boron defects and the resultant ionised defects do not give rise to significant optical absorption.

For a given set of growth conditions (such as, substrate temperature, pressure and plasma temperature) the inventors have found that there is a threshold nitrogen concentration that can be tolerated by the CVD diamond synthesis process before the surface roughens and the grown diamond becomes brown. However, the threshold nitrogen concentration tends to be so low that considerable time and expense is involved to achieve a nitrogen concentration below the threshold in order to avoid the incorporation of defects affecting the material's optical and other properties.

The inventors of the present invention have found that the addition of a second impurity atom type (such as boron or silicon) to the growth gases can significantly increase the threshold nitrogen concentration to levels that might be present in growth environments when relatively little attention is given to nitrogen elimination. This allows diamond to be grown in the presence of relatively high concentrations of nitrogen without the degradation of the optical and other properties that would otherwise result because of the incorporation of defects such as vacancy clusters and hydrogen-related defects. In addition it has been surprisingly found that this is possible even though there may be significant incorporation into the grown diamond of both nitrogen and the second impurity atom type.

It is known in the prior art (WO 2005/061400) to deliberately add certain dopants to the synthesis atmosphere of CVD single crystal diamond in order to provide the single crystal CVD diamond with a "tag", that is, a mark of origin or fingerprint. The dopant is selected such that the mark of origin or fingerprint is not readily detectable or does not affect the perceived quality of the diamond material under normal viewing conditions but which is detectable or rendered detectable under specialised conditions, such as when exposed to light or radiation or a specified wavelength.

In contrast, the present invention relates to the use of a second impurity atom type to counter the detrimental effect on colour of a first impurity atom type present in the CVD synthesis atmosphere. In this way, the present invention enables a CVD diamond to be produced which has high colour even though the CVD synthesis atmosphere comprises an amount of a first impurity atom type which would otherwise produce a diamond not having high colour. This has the advantage of removing the need to take special steps to eliminate impurity atom types known to adversely affect the colour of diamond from the synthesis atmosphere merely by adding a particular type and amount of a second impurity atom. Consequently, the synthesis of CVD diamond can be simplified and is more efficient in both time and cost.

The CVD diamond layer produced by the method of the present invention may be a single crystal.

Alternatively, the CVD diamond layer may be polycrystalline. Polycrystalline CVD diamond layers are well known in the art. They are generally grown on a non-diamond substrate (for example silicon, silicon carbide, tungsten, molybdenum and other carbide forming metals). Growth from multiple randomly located and oriented nuclei combined with a growth mechanism in which the growth rate varies with crystallographic direction results in polycrystalline layer in which the grains have growth directions that are more-or-less aligned with a single crystallographic direction (e.g. parallel to <100> or <110>), but randomly oriented perpendicular to the growth direction (i.e. in the plane of the layer). Such a disc is described by those skilled in the art as having a 'wire texture'.

Alternatively, the CVD diamond layer may heteroepitaxial. Heteroepitaxial CVD diamond layers are well known in the art. They are generally grown on single crystal substrates of non-diamond materials including silicon, silicon carbide, strontium titanate and iridium. Often complex interlayer structures are used between the substrate and the CVD diamond layer to control strain and reduce the impact of thermal expansion mismatch. The nuclei of a heteroepitaxial diamond layer initially form with a specific orientation relationship with the substrate and then grow into 'domains' of diamond that are more-or-less in the same crystallographic orientation, normally with a definite relationship to a direction in the single crystal substrate. The domains are normally separated by low angle boundaries. Domains with lateral sizes of several hundred micrometers have been reported for layers a few tens of micrometers thick.

In the method of the present invention, the first impurity atom type is preferably nitrogen and the second impurity atom type is selected from silicon, boron, phosphorus or sulphur. In this way, the addition of a gaseous source comprising silicon, boron, phosphorus or sulphur impurity atom types counters the detrimental effect on colour of diamond that nitrogen would otherwise have. More preferably, the second impurity atom type is silicon and hence the silicon impurity atoms counter the detrimental effect on colour of diamond of nitrogen impurity atoms. Alternatively the second impurity atom type is boron and hence the boron impurity atoms counter the detrimental effect on colour of diamond of nitrogen impurity atoms.

Alternatively, the first impurity atom type is silicon, boron, phosphorus or sulphur and the second impurity atom type is nitrogen. In this way, the addition of a gaseous source comprising nitrogen impurity atoms counters the detrimental effect on colour of diamond that either silicon, boron, phosphorus or sulphur would have. More preferably, the first impurity atom type is silicon and hence the nitrogen impurity atoms counter the detrimental effect on colour of diamond of silicon impurity atoms. Alternatively, the first impurity atom type is boron and hence nitrogen impurity atoms counter the detrimental effect on colour of diamond of boron impurity atoms.

Where the first or second impurity atom type is nitrogen, the first or second gas may be any gaseous species which contains nitrogen including $N_2$, $NH_3$ (ammonia), $N_2H_4$ (hydrazine) and HCN (hydrogen cyanide). Preferably, the first or second gas is $N_2$, $NH_3$, or $N_2H_4$. Preferably, the first or second gas is $N_2$ or $NH_3$, preferably the first or second gas is $N_2$. The nitrogen present in the synthesis atmosphere is calculated as parts per million (ppm) or parts per billion (ppb) of molecular nitrogen (ie $N_2$) as a molecular fraction of the total gas volume. Thus 100 ppb of nitrogen added as molecular nitrogen ($N_2$) is equivalent to 200 ppb of atoms of nitrogen or 200 ppb of ammonia ($NH_3$).

For impurity additions other than nitrogen, the gas phase concentration in ppm or ppb refers to the concentration in synthesis atmosphere of the impurity added as the preferred gaseous species.

Where the first or second impurity atom type is boron, the first or second gas is preferably $B_2H_6$, BCl or $BH_3$. Preferably, the first or second gas is $B_2H_6$.

Where the first or second impurity atom type is silicon, the first or second gas is preferably $SiH_4$, or $Si_2H_6$. Preferably, the first or second gas is $SiH_4$.

Where the first or second impurity atom type is sulphur, the first or second gas is preferably $H_2S$.

Where the first or second impurity atom type is phosphorus, the first or second gas is preferably $PH_3$.

For silicon, boron, sulphur and phosphorus if gaseous species other than the preferred species (ie $B_2H_6$, $SiH_4$, $H_2S$ and $PH_3$) are used to add the impurity atom type to the synthesis environment, the number of atoms of the impurity atom type in the molecular species added must be accounted for in determining the concentration of that species in the synthesis environment.

The impurity atom types are added to the synthesis atmosphere as gases. Although it is possible, with the exception of nitrogen, to add all the impurity atom types as single element solids, it is extremely difficult, if not impossible, to accurately and reproducibly control the rate at which such additions are made. For example, additions of boron have been made by exposing solid boron to the synthesis atmosphere; the same applies to silicon where solid sources have been used. However, gaseous sources of the impurity atom types are used in the method of the present invention because the gaseous source of an impurity atom type may be prepared in a highly pure form, diluted gravimetrically with a carrier gas and then analysed post-manufacture to accurately determine the exact concentration. Given the gas concentration, precise and reproducible additions can be added using gas metering devices such as mass-flow controllers.

The first impurity atom type may be nitrogen and the second impurity atom type may be sulphur. The first impurity atom type may be nitrogen and the second impurity atom type may be phosphorus. The first impurity atom type may be sulphur and the second impurity atom type may be nitrogen. The first impurity atom type may be phosphorus and the second impurity atom type may be nitrogen. The first impurity atom type may be phosphorus and the second impurity atom type may be sulphur. The first impurity atom type may be sulphur and the second impurity atom type may be phosphorus. The first impurity atom type may be boron and the second impurity atom type may be silicon. The first impurity atom type may be silicon and the second impurity atom type may be boron. The first impurity atom type may be boron and the second impurity atom type may be phosphorus. The first impurity atom type may be phosphorus and the second impurity atom type may be boron. The first impurity atom type may be boron and the second impurity atom type may be sulphur. The first impurity atom type may be sulphur and the second impurity atom type may be boron. The first impurity atom type may be silicon and the second impurity atom type may be phosphorus. The first impurity atom type may be phosphorus and the second impurity atom type may be silicon. The first impurity atom type may be silicon and the second impurity atom type may be sulphur. The first impurity atom type may be sulphur and the second impurity atom type may be silicon.

The incorporation of an impurity atom type from the synthesis atmosphere into the solid diamond is highly dependent upon the exact details of the synthesis process. Such matters have been well detailed in the prior art and are well known to those skilled in the art. Parameters that influence the level of incorporation include the nature of the molecular species used to provide the impurity atom, the temperature of the synthesis atmosphere, the pressure of the synthesis atmosphere, the temperature of the surface of the substrate, the crystallographic nature of the surface and the gas flow conditions with the synthesis system.

Where the first or second gas source comprises nitrogen, the concentration of the gas comprising nitrogen in the synthesis atmosphere may be greater than 300 ppb, greater than 500 ppb, greater than 600 ppb, greater than 1 ppm, greater than 2 ppm, greater than 3 ppm, greater than 5 ppm, greater than 10 ppm, greater than 20 ppm, greater than 30 ppm. The concentration of the gas comprising nitrogen may be in the range from 300 ppb to 30 ppm, 500 ppb to 20 ppm, 600 ppb to 10 ppm, 1 ppm to 5 ppm, or 2 ppm to 3 ppm.

When the first or second gas source comprises boron, the concentration of the gas comprising boron in the synthesis atmosphere may be greater than 0.5 ppb, greater than 1.0 ppb, greater than 2 ppb, greater than 5 ppb, greater than 10 ppb, greater than 20 ppb, greater than 50 ppb, greater than 0.1 ppm, greater than 0.2 ppm. The concentration of the gas comprising boron in the synthesis atmosphere may be from 0.5 ppb to 0.2 ppm, from 1.0 ppb to 0.1 ppm, from 2 ppb to 50 ppb, from 10 ppb to 20 ppb. The concentration of the gas comprising boron in the synthesis atmosphere may be less than 1.4 ppm, less than 0.1 ppm, or less than 0.05 ppm.

When the first or second gas source comprises silicon, the concentration of the gas comprising silicon in the synthesis atmosphere may be greater than 0.01 ppm, greater than 0.03 ppm, greater than 0.1 ppm, greater than 0.2 ppm, greater than 0.5 ppm, greater than 1 ppm, greater than 2 ppm, greater than 5 ppm, greater than 10 ppm, greater than 20 ppm. The concentration of the gas source comprising silicon in the synthesis atmosphere may be from 0.01 ppm to 20 ppm, 0.03 ppm to 10 ppm, 0.1 ppm to 5 ppm, 0.2 ppm to 2 ppm, or 0.5 ppm to 1 ppm.

Secondary Ion Mass Spectrometry (SIMS) measurements have shown that, for a given concentration of silicon in the growth gases, in the absence of nitrogen, the concentration of silicon in the grown diamond is higher for {111}, {110} or {113} growth than for {100} growth. For growth on a substrate with {100} orientation, although gaseous silicon impurity tends to increase the threshold nitrogen concentration for surface roughening, addition of high concentrations of nitrogen to the growth gases will eventually cause the surface to roughen and the efficiency of silicon incorporation to increase dramatically. When this happens SIMS measurements indicate that the concentration of silicon in the diamond can significantly exceed that of nitrogen and in such cases the diamond will generally show a grey colour resulting from high concentrations of the defect responsible for a spectroscopic feature at 945 nm in the absorption spectrum (currently believed to be a neutral silicon-vacancy defect). In general, as the concentration of gaseous silicon is increased the grey colour is perceived earlier for material grown on {111}, {110} or {113} than for {100} growth.

When silicon is the first or the second impurity atom type, the concentration of silicon in the majority volume of the diamond layer produced may be less than or equal to $2\times10^{18}$ atoms/cm$^3$. The concentration of silicon in the majority volume of the diamond layer may be in the range from $10^{14}$ atoms/cm$^3$ to $2\times10^{18}$ atoms/cm$^3$, from $3\times10^{14}$ atoms/cm$^3$ to $10^{17}$ atoms/cm$^3$, from $10^{15}$ atoms/cm$^3$ to $3\times10^{16}$ atoms/cm$^3$, or from $3\times10^{15}$ atoms/cm$^3$ to $10^{16}$ atoms/cm$^3$. The concentration of silicon in the majority volume of the diamond layer may be greater than $10^{13}$ atoms/cm$^3$, greater than $10^{14}$ atoms/cm$^3$, greater than $3\times10^{14}$ atoms/cm$^3$, greater than $10^{15}$ atoms/cm$^3$, greater than $3\times10^{15}$ atoms/cm$^3$, greater than $10^{16}$, greater than $3\times10^{16}$ atoms/cm$^3$, greater than $10^{17}$ atoms/cm$^3$.

When nitrogen is the first or the second impurity atom type, the concentration of nitrogen in the majority volume of the diamond layer may be from $1\times10^{14}$ atoms/cm$^3$ to $5\times10^{17}$ atoms/cm$^3$, from $5\times10^{15}$ atoms/cm$^3$ to $2\times10^{17}$ atoms/cm$^3$, or from $1\times10^{16}$ to $5\times10^{16}$ atoms/cm$^3$. The concentration of nitrogen in the majority volume of the diamond layer may be greater than $2\times10^{15}$ atoms/cm$^3$, greater than $5\times10^{15}$ atoms/cm$^3$, greater than $10^{16}$ atoms/cm$^3$, greater than $3\times10^{16}$ atoms/cm$^3$, greater than $10^{17}$ atoms/cm$^3$.

When boron is the first or the second impurity atom type, the concentration of boron in the majority volume of the diamond layer may be from $10^{14}$ atoms/cm$^3$ to $10^{18}$ atoms/cm$^3$, from $3\times10^{14}$ atoms/cm$^3$ to $10^{17}$ atoms/cm$^3$, from $10^{15}$ atoms/cm$^3$ to $10^{16}$ atoms/cm$^3$, or from $3\times10^{15}$ atoms/cm$^3$ to $10^{15}$ atoms/cm$^3$. The concentration of boron in the majority volume of the diamond layer may be greater than $10^{13}$ atoms/$cm^3$, greater than $10^{14}$ atoms/$cm^3$, greater than $3\times10^{14}$ atoms/$cm^3$, greater than $10^{15}$ atoms/$cm^3$, greater than $3\times10^{15}$ atoms/$cm^3$, greater than 1016, greater than $3\times10^{16}$ atoms/$cm^3$, greater than $10^{17}$ atoms/$cm^3$.

Typically, the concentration of the first and second impurity atom types, as well as the concentration of any other impurities in the diamond layer, may be measured using secondary ion mass spectroscopy (SIMS). Detection limits for impurity atoms vary depending on the SIMS conditions used. However, SIMS detection limits for the first and second impurity atom types of the present invention typically lie in the range 1014 to $10^{17}$ atoms/$cm^3$. In particular, for elements such as boron and silicon the detection limits are typically about $10^{15}$ atoms/$cm^3$, whereas for nitrogen they are typically about $10^{16}$ atoms/$cm^3$. Other techniques, such as combustion analysis, absorption, EPR, can give higher sensitivity in some instances.

When the first and second impurity atom types are nitrogen and silicon, respectively or vice versa, the concentration of nitrogen in the majority volume of the diamond layer is preferably less than or equal to $2\times10^{17}$ atoms/$cm^3$ and the concentration of silicon in the majority volume of the diamond layer is preferably less than or equal to $2\times10^{18}$ atoms/$cm^3$. In this way, high colour in the synthesised diamond may be more readily achieved.

When the first and second impurity atom types are nitrogen and silicon, respectively or vice versa, the ratio of the concentration of nitrogen to silicon in the majority volume of the diamond layer produced may be 1:20 to 20:1, 1:10 to 10:1, 1:9 to 9:1, 1:8 to 8:1, 1:7 to 7:1, 1:6 to 6:1, 1:5 to 5:1, 1:4 to 4:1, 1:3 to 3:1, 1:2 to 2:1, preferably 1:1.

When the first and second impurity atom types are nitrogen and silicon, respectively or vice versa, the gas comprising nitrogen may be present in the synthesis atmosphere at a concentration of greater than 100 ppb, greater than 200 ppb, greater than 300 ppb and the gas comprising silicon may be present in the synthesis atmosphere at a concentration of greater than 10 ppb.

When the first and second impurity atom types are nitrogen and boron, respectively or vice versa, the ratio of the concentration of nitrogen to the concentration of boron in the majority volume of the diamond layer may be in the range from 1:2 to 2:1, from 2:3 to 3:2, from 3:4 to 4:3, from 4:5 to 6:5, from 9:10 to 11:10, preferably the ratio is 1:1. Preferably, the ratio of nitrogen to boron is greater than 1:5.

When single substitutional boron and nitrogen are present in diamond in approximately the same concentrations, colourless material can result because the nitrogen defects donate electrons to the boron defects and the resultant ionised defects do not give rise to significant optical absorption. Thus, not only does boron have a beneficial effect on growth in the presence of nitrogen because of the fact that it suppresses roughening of the growth surface, boron and nitrogen incorporated into the diamond can compensate each other to give material with low optical absorption.

When the first and second impurity atom types are nitrogen and boron, respectively or vice versa, the gas comprising nitrogen may be present in the synthesis atmosphere at a concentration of greater than 100 ppb, preferably greater than 200 ppb, preferably greater than 300 ppb and the gas comprising boron may be present in the synthesis atmosphere at a concentration of greater than 0.5 ppb.

Preferably, the CVD diamond layer produced by any of the above methods has an increased normalized free exciton intensity compared to a method where the second gas comprising a second impurity type atom is not added. Preferably, there is a strong free exciton luminescence in the cathodoluminescence spectrum measured at 77 K, with the integrated intensity of the free exciton luminescence exceeding 0.3, preferably exceeding 0.4, preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions.

The CVD diamond layer produced by any of the above methods may have an increase in carrier mobility, carrier lifetime, charge collection distance and/or charge collection efficiency compared to a method where the second gas comprising a second impurity type atom is not added. The charge collection distance of the produced diamond layer may be greater than 100 µm, greater than 150 µm, greater than 200 µm, greater than 300 µm, greater than 500 µm, or greater than 1000 µm when measured with an applied electric field of 1.0 V/µm. A method of measuring charge collection distance in diamond is described in WO 01/96633, for example. The carrier mobility of the produced diamond layer may be 1200 $cm^2V^{-1}\ s^{-1}$, preferably 1500 $cm^2V^{-1}\ s^{-1}$, preferably 1800 $cm^2V^{-1}\ s^{-1}$, preferably 2200 $cm^2V^{-1}\ s^{-1}$, preferably 2500 $cm^2V^{-1}\ s^{-1}$. Preferably the charge collection efficiency of the produced diamond layer is 30%, preferably 50%, preferably 70%, preferably 80%, preferably 90%, preferably 95%, preferably 97%. The carrier lifetime of the produced diamond layer may be greater than 1 ns, greater than 3 ns, greater than 10 ns, greater than 30 ns, or greater than 100 ns.

Nitrogen as an impurity is known to affect the electronic properties of single crystal CVD diamond, in particular the charge collection distance, carrier mobilities and carrier lifetimes. In the absence of nitrogen the electronic properties of single crystal CVD diamond can be very good (see for example Isberg et al, Science, volume 297, pages 1970-1672, where methods of measurement and results are disclosed). As nitrogen is progressively added to the synthesis atmosphere, the electronic properties of the resultant material are progressively degraded.

Previous experimentation has shown that the intensity of the free exciton emission at 235 nm measured at 77 K is a good proxy for the electronic properties (WO 01/96633). Using this proxy, we are able to propose the following expected behaviour for combined nitrogen and silicon additions to diamond.

If silicon is added with nitrogen, the deleterious effects of the nitrogen on electronic properties are ameliorated, with the amount of amelioration increasing, but the rate of amelioration decreasing, as the concentration of silicon added is increased, until at some fraction of the concentration of nitrogen being incorporated, adding further silicon ceases to have a further ameliorating effect at which point the properties start to degrade once more.

Therefore there will be an optimum amount of silicon that can be added for a given amount of nitrogen in the solid, but the optimum value is dependent on the exact property that is being considered and the amount of nitrogen incorporated. The inventors expect that the optimum value of silicon addition with regard to its effect on the electronic properties is generally somewhat less than the silicon addition at which the colour of the diamond starts degrading (ie the greyness caused by silicon begins to become apparent).

Thus, it is possible for a series of diamonds containing a given concentration of nitrogen and different concentrations of silicon (ranging from just above zero to well beyond the optimum) to have electronic properties that can be slightly better, much better, the same or worse than an otherwise identical diamond containing no silicon.

It is equally possible for a diamond of the invention to have poor electronic properties (i.e. the silicon concentration is well beyond the optimum), but good optical properties as the greyness caused by the silicon has not yet become sufficient to be perceived as a colour change or caused a significant change to the optical absorption spectrum.

A similar situation pertains when boron is added to a synthesis atmosphere containing diamond. Initially the boron ameliorates the deleterious effects of the nitrogen and the electronic properties improve. As the amount of boron added is increased, at some point, probably when the amounts of nitrogen and boron are approximately equal, the improvement in the electronic properties will stop and then, with higher rates of addition, begin to decline. This behaviour can be understood with a classical semiconductor compensation model. The rate of improvement and subsequent decline in the properties is expected to be much sharper than for the case of nitrogen and silicon.

The first gas comprising a first impurity atom type may be deliberately added to the synthesis atmosphere. Alternatively, the first gas may be present in the synthesis atmosphere unintentionally, including being present in the synthesis atmosphere because it has not been removed even though it affects properties of the diamond layer produced. Preferably, the synthesis atmosphere comprises a concentration of the first gas, which has not been added deliberately, of greater than 0.1 ppb, preferably greater than 1 ppb, preferably greater than 10 ppb. An example of such a situation is where nitrogen remains in the synthesis atmosphere in the form of $NH_3$, air or $N_2H_4$, for example, and it is considered too expensive or time consuming to adopt extra measures to remove such gases from the synthesis atmosphere. Preferably, the synthesis atmosphere comprises a concentration of the gas comprising nitrogen, which has not been added deliberately, of greater than 300 ppb.

The first gas may be present in the synthesis atmosphere in a manner which is controlled or in a manner which is not controlled. Where the first gas is present in a manner which is not controlled, the first impurity type atom may be present as an impurity of one of the gases required for diamond synthesis. Alternatively, where the first gas is added in a manner which is controlled, this may be such that there is only an upper limit of the amount of gas that may be introduced into the synthesis atmosphere. Alternatively, the presence of the first gas may be controlled such that the concentration of the first gas is stable to better than 20%, preferably better than 10%, preferably better than 3%.

Preferably, the diamond layer is greater than 0.1 mm thickness, preferably greater than 0.5 mm thickness, preferably greater than 1 mm thickness, preferably greater than 2 mm thickness.

In the method of the first embodiment:
(1) the substrate may be a diamond substrate having a surface which is substantially free of crystal defects such that a revealing plasma etch would reveal a density of surface etch features related to defects below $5 \times 10^3 / mm^2$;
(2) the duration of the synthesis of the diamond layer may be at least 50 hours; and/or
(3) the substrate may comprises multiple separated single crystal diamond substrates.

The method may comprise at least one, preferably at least two, preferably all three of features (1) to (3). The method may comprise feature (1), feature (2), feature (3), features (1) and (2), features (1) and (3), features (2) and (3), or features (1), (2) and (3).

By using a diamond substrate having a surface which is substantially free of crystal defects, the quality of the grown diamond can be greatly improved. In particular, fewer defects will be present in the grown diamond layer.

The substrate may be a single diamond substrate, such as in 1) above. Alternatively, the substrate may be a plurality of separated single crystal diamond substrates. Preferably, the plurality of substrates are separated laterally. The plurality of separated single crystal diamond substrates may each be substantially free of crystal defects as for feature 1) above. The plurality of laterally separated single crystal diamond substrates may be grown on simultaneously in the same synthesis system under substantially the same growth conditions.

The method may comprise using separated multiple single crystal diamond substrates. Preferably there are greater than 5, greater than 20, greater than 50, greater than 80, greater than 100, greater than 120, greater than 150, greater than 200 single crystal substrates. Use of such multiple separated single crystal diamond substrates may produce multiple single crystal diamond layers. Alternatively, polycrystalline diamond layers may be produced which extend laterally in at least one direction greater than 30 mm, preferably greater than 60 mm, preferably greater than 90 mm, preferably greater than 110 mm, preferably greater than 130 mm.

The duration of the synthesis of the diamond layer may be at least 50 hours, at least 75 hours, at least 100 hours, at least 150 hours.

In a second embodiment of the present invention there is provided a method of producing a CVD diamond layer, comprising:
(i) providing a substrate;
(ii) providing a CVD synthesis atmosphere in which there exists a concentration of nitrogen which is not deliberately added of greater than 300 ppb; and
(iii) adding into the synthesis atmosphere a second gas comprising a second impurity atom type other than nitrogen,
wherein the second impurity atom type is added in a controlled manner in an amount that reduces the detrimental effect on the colour caused by the nitrogen so as to produce a diamond layer having high colour; and the second impurity atom type is solid in the elemental state.

In this way, a CVD diamond layer having high colour may be produced even though the synthesis atmosphere comprises an amount of nitrogen that, in the absence of the second gas, would have an undesirable affect on the colour of the produced diamond such that the produced diamond would not have high colour. The method of the second embodiment enables high colour CVD diamond to be synthesised without having to take any additional steps to remove the undesirable nitrogen from the synthesis atmosphere. The term "high colour" is as defined previously. Preferably, the diamond layer has very high colour, as defined previously.

In the second embodiment of the invention, the CVD diamond layer may be a single crystal. Alternatively, in the second embodiment of the invention, the CVD diamond layer may be polycrystalline.

The preferred features of the first embodiment of the method of the present invention outlined above apply equally to the second embodiment of the method of the present invention as long as the first source gas comprises nitrogen.

In particular, the second impurity atom type may be boron, silicon, phosphorus or sulphur. Preferably, the second impurity atom type is silicon.

In the method of the second embodiment of the present invention, the concentration of nitrogen that is not deliberately added to the synthesis atmosphere may be added in an uncontrolled manner. In addition to the concentration of nitrogen that is not deliberately added to the synthesis atmosphere, additional nitrogen may be added deliberately to the synthesis atmosphere.

In a third embodiment of the present invention there is provided a method of producing a CVD diamond layer comprising the steps of:
(i) providing a substrate; and
(ii) adding into a CVD synthesis atmosphere a gaseous source comprising silicon.

In this way a silicon doped diamond layer is provided. Preferably, in the third embodiment of the invention, the CVD diamond layer is a single crystal. Alternatively, in the third embodiment of the invention, the CVD diamond layer is polycrystalline.

In the method of the third embodiment:
(1) the layer may be grown to greater than 0.1 mm thickness;
(2) the substrate may be a diamond substrate having a surface which is substantially free of crystal defects such that a revealing plasma etch would reveal a density of surface etch features related to defects below $5\times10^3/mm^2$;
(3) the duration of the synthesis of the single crystal diamond layer may be at least 50 hours; and/or
(4) the substrate may comprise multiple separated single crystal diamond substrates.

The method may comprise at least one, at least two, at least three, preferably all four of features (1) to (4). The method may comprise feature (1), feature (2), feature (3), feature (4), features (1) and (2), features (1) and (3), features (1) and (4), features (2) and (3), features (2) and (4), features (3) and (4), features (1), (2) and (3), features (1), (3) and (4), features (2), (3) and (4), The layer may be grown to a thickness of greater than 0.5 mm, greater than 1 mm, greater than 2 mm.

The duration of the synthesis of the diamond layer may be at least 50 hours, at least 75 hours, at least 100 hours, at least 150 hours.

The method may comprise using multiple separated single crystal diamond substrates. Preferably there are greater than 5, preferably greater than 20, preferably greater than 50 single crystal substrates. Use of such multiple separated single crystal diamond substrates may produce multiple single crystal diamond layers. Alternatively, polycrystalline diamond layers may be produced which extend laterally in at least one direction greater than 30 mm, preferably greater than 60 mm, preferably greater than 90 mm, preferably greater than 110 mm, preferably greater than 130 mm.

The preferred features of the first embodiment of the method of the present invention outlined above apply equally to the third embodiment of the method of the present invention as long as the first or second source gases comprise silicon.

The concentration of silicon in the majority volume of the diamond layer produced by the third embodiment of the method of the present invention may be up to $2\times10^{18}$ atoms/$cm^3$, from $10^{14}$ atoms/$cm^3$ to $2\times10^{18}$ atoms/$cm^3$, from $3\times10^{14}$ atoms/$cm^3$ to $10^{17}$ atoms/$cm^3$, from $10^{15}$ atoms/$cm^3$ to $3\times10^{16}$ atoms/$cm^3$, from $3\times10^{15}$ atoms/$cm^3$ to $10^{16}$ atoms/$cm^3$, from $2\times10^{17}$ to $2\times10^{18}$ atoms/$cm^3$.

In the third embodiment of the method of the present invention, the addition of silicon may reduce an adverse effect on a property of the produced diamond layer caused by the presence of an impurity atom type. Preferably, the impurity atom type is nitrogen. The impurity atom type may be introduced into the synthesis atmosphere as a gas in a controlled or uncontrolled manner, as described previously. Preferably, the impurity atom type is nitrogen and the synthesis atmosphere comprises a concentration of nitrogen which is not deliberately added of greater than 300 ppb.

The property may be colour and adding silicon may produce a CVD diamond layer having high colour, wherein "high colour" is as defined above. Preferably, the CVD diamond layer has very high colour, wherein "very high colour" is as defined above.

The property may be free exciton emission of the diamond layer and adding silicon may produce a CVD diamond layer with an Increased normalized free exciton intensity compared to a method where silicon is not added. There may be a strong free exciton luminescence in the cathodoluminescence spectrum measured at 77 K, with the integrated intensity of the free exciton luminescence exceeding 0.3, preferably exceeding 0.4, preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions.

The property may be at least one of: carrier mobility; carrier lifetime; and charge collection distance and adding silicon may produce a CVD diamond layer with an increase in carrier mobility, carrier lifetime and/or charge collection distance compared to a method where silicon is not added. The charge collection distance of the produced diamond layer may be greater than 100 μm, greater than 150 μm, greater than 200 μm, greater than 300 μm, greater than 500 μm, greater than 1000 μm when measured with an applied electric field of 1.0 V/μm. The carrier mobility of the produced diamond layer may be 1200 $cm^2V^{-1}$ $s^{-1}$, preferably 1500 $cm^2V^{-1}$ $s^{-1}$, preferably 1800 $cm^2V^{-1}$ $s^{-1}$, preferably 2200 $cm^2V^{-1}$ $s^{-1}$, preferably 2500 $cm^2V^{-1}$ $s^{-1}$. The charge collection efficiency of the produced diamond layer may be 30%, preferably 50%, preferably 70%, preferably 80%, preferably 90%, preferably 95%, preferably 97%. The carrier lifetime of the produced diamond layer may be greater than 1 ns, greater than 3 ns, greater than 10 ns, greater than 30 ns, greater than 100 ns.

In any of the methods described above (that is, for the first, second and third embodiments), when the CVD diamond layer is a single crystal, the majority volume of the diamond layer may have at least one of the following features:
a) an absorption spectrum measured at room temperature such that the colour of a standard 0.5 ct round brilliant would be better than K;
b) an absorption coefficient at 270 nm measured at room temperature which is less than 1.9 $cm^{-1}$;
c) an absorption coefficient at 350 nm measured at room temperature which is less than 0.90 $cm^{-1}$;
d) an absorption at 520 nm of less than 0.30 $cm^{-1}$; or
e) an absorption at 700 nm of less than 0.12 $cm^{-1}$.

The majority volume of the diamond layer may comprise at least 55%, preferably at least 60%, preferably at least 70%, preferably at least 80%, preferably at least 90%, preferably at least 95% of the diamond layer.

The single crystal diamond layer may have at least two, at least three, at least four, preferably all five of the features (a) to (e). The diamond layer may have features a) and b); features a) and c); a) and d); a) and e); b) and c); b) and d); b) and e); c) and d); c) and e); d) and e); a), b) and c); a), b) and d); a), b) and e); a), c) and d); a), c) and e); a), d) and e); b), c) and d); b), c) and e); b), d) and e); c), d) and e); a), b), c) and d); a), b), c) and e); a), b), d) and e); a), c), d) and a); b), c), d) and e); or a), b), c), d) and e).

Preferably, for feature a), the diamond layer has an absorption spectrum measured at room temperature such that the colour of a standard 0.5 ct round brilliant would be better than J, preferably better than I; preferably better than H, preferably better than G, preferably better than F, preferably better than E, preferably D.

Preferably, for feature b), the diamond layer has an absorption coefficient at 270 nm measured at room temperature which is less than 1.0 cm$^{-1}$; preferably less than 0.4 cm$^{-1}$.

Preferably, for feature c), the diamond layer has an absorption coefficient at 350 nm measured at room temperature which is less than 0.5 cm$^{-1}$; preferably less than 0.2 cm$^{-1}$.

Preferably, for feature d), the diamond layer has an absorption coefficient at 520 nm measured at room temperature which is less than 0.14 cm$^{-1}$; preferably less than 0.06 cm$^{-1}$.

Preferably, for feature e), the diamond layer has an absorption coefficient at 700 nm measured at room temperature which is less than 0.06 cm$^{-1}$; preferably less than 0.03 cm$^{-1}$.

In any of the methods described above (that is, relating to the first, second and third embodiments), when the CVD diamond layer is polycrystalline, the majority volume of the diamond layer may have at least one of the following features:
  a) an absorption coefficient at 270 nm measured at room temperature which is less than 1.9 cm$^{-1}$;
  b) an absorption coefficient at 350 nm measured at room temperature which is less than 0.90 cm$^{-1}$;
  c) an absorption at 520 nm of less than 0.30 cm$^{-1}$; and
  d) an absorption at 700 nm of less than 0.12 cm$^{-1}$.

The polycrystalline diamond layer may have feature a), feature b), feature c), feature d), features a) and b), features a) and c), features a) and d), features b) and c), features b) and d), features c) and d), features a) b) and c), features a) b) and d), features a) c) and d), features b) c) and d), or features a), b), c) and d).

Preferably, for feature a), the diamond layer has an absorption coefficient at 270 nm measured at room temperature which is less than 1.0 cm$^{-1}$; preferably less than 0.4 cm$^{-1}$.

Preferably, for feature b), the diamond layer has an absorption coefficient at 350 nm measured at room temperature which is less than 0.5 cm$^{-1}$; preferably less than 0.2 cm$^{-1}$.

Preferably, for feature c), the diamond layer has an absorption coefficient at 520 nm measured at room temperature which is less than 0.14 cm$^{-1}$; preferably less than 0.06 cm$^{-1}$.

Preferably, for feature d), the diamond layer has an absorption coefficient at 700 nm measured at room temperature which is less than 0.06 cm$^{-1}$; preferably less than 0.03 cm$^{-1}$.

In any of the methods outlined above where the CVD diamond layer is a single crystal, the diamond layer is preferably formed into a gemstone having three orthogonal dimensions greater than 2 mm, where at least one axis lies either along the <100> crystal direction or along the principle symmetry axis of the gemstone.

According to the present invention there is provided a CVD diamond layer produced by any one of the methods disclosed above.

Where the CVD diamond layer is a single crystal, the majority volume of the diamond layer may be formed from a single growth sector.

In view of the reduction in defects in the diamond layer produced by any of the methods of the invention described above because of a reduction in surface roughening during growth, the diamond layer may also have improved mechanical and chemical properties, including wear resistance and thermal stability. The wear properties of a material are the result of very complex interactions between a wide range of the macroscopic properties of the material including, for example, its hardness, strength, stiffness, toughness, grain size, thermal conductivity, grain orientation etc. It is well known in the art that diamond has exceptional wear properties and these are widely exploited: it is used as a tool material in a wide range of applications including cutting tools, rock drill, wire dies and many others.

The performance of a diamond tool in a particular application is strongly influenced by its microstructure and in the particular case of single crystal diamond, the point and extended defect densities. A particular example is a wire drawing die as disclosed in WO2004/074557, where reducing the strain by controlling extended defect density is shown to be particularly effective at improving the wear properties. Since the methods of the invention can provide single crystal diamond material with reduced point and extended defect densities compared with diamond prepared using generally the same method without the added second impurity, it can be reasonably expected that the material of the invention will have improved wear properties.

According to the present invention there is also provided a CVD diamond layer comprising an impurity atom type selected from silicon, sulphur or phosphorus, wherein the diamond layer has high colour.

According to the present invention there is provided a CVD diamond layer comprising an impurity atom type selected from silicon, sulphur or phosphorus wherein the concentration of the impurity atom type in the majority volume of the diamond layer is from $10^{14}$ to $2\times10^{18}$ atoms/cm$^3$. The concentration of silicon in the majority volume of the diamond layer may be greater than $10^{13}$ atoms/cm$^3$, greater than $10^{14}$ atoms/cm$^3$, greater than $3\times10^{14}$ atoms/cm$^3$, greater than $10^{15}$ atoms/cm$^3$, greater than $3\times10^{15}$ atoms/cm$^3$, greater than $10^{16}$, greater than $3\times10^{16}$ atoms/cm$^3$, greater than $10^{17}$ atoms/cm$^3$. The concentration of the impurity atom type may be from $3\times10^{14}$ atoms/cm$^3$ to $10^{17}$ atoms/cm$^3$, from $10^{15}$ atoms/cm$^3$ to $3\times10^{15}$ atoms/cm$^3$, or from $3\times10^{15}$ atoms/cm$^3$ to $10^{16}$ atoms/cm$^3$, from $10^{16}$ to $2\times10^{17}$ atoms/cm$^3$, from $2\times10^{16}$ to $10^{17}$ atoms/cm$^3$, greater than $2\times10^{17}$ atoms/cm$^3$. Preferably, the majority volume of the CVD diamond layer comprises from $2\times10^{17}$ to $2\times10^{18}$ atoms/cm$^3$ of an impurity atom type selected from silicon, sulphur or phosphorus. Preferably, the impurity atom type is silicon. The CVD diamond layer may be a single crystal. Alternatively, the CVD diamond layer may be polycrystalline.

Photoluminescence spectroscopy offers a sensitive method for detecting the presence of silicon-related defects in diamond. A silicon-related photoluminescence line at 737 nm can generally be detected with 633 nm HeNe laser excitation at 77 K. Research by the present inventors has indicated that the photoluminescence spectrum of silicon-doped diamond, excited at 77 K with 785 nm laser radiation, also often shows a line at 946 nm. This is generally accompanied by another line at 975 nm. These two photoluminescence lines have not been reported before. FIG. 2 shows a typical photoluminescence spectrum for silicon-doped diamond excited with 785 nm laser radiation.

The present inventors have also investigated silicon-doped samples using EPR (Electron Paramagnetic Resonance). This offers a sensitive method for detecting and characterising silicon-related defects. The current detection limits allow defect concentrations as low as one part per billion to be measured. A neutral silicon-vacancy defect has recently been detected and characterised using EPR, and work is proceeding to identify other silicon related defects in the same way. Current results suggest that the 946 nm photoluminescence line may be an optical signature of the neutral silicon vacancy defect identified using EPR.

Preferably, the CVD diamond layer has high colour, wherein "high colour" is as defined above.

Preferably, the CVD diamond layer has a thickness of greater than 0.1 mm, preferably greater than 0.5 mm, preferably greater than 1 mm, preferably greater than 2 mm.

The CVD diamond layer produced by any of the methods of the present invention may have a birefringence of less than $1\times10^{-3}$, preferably less than $1\times10^{-4}$, preferably less than $3\times10^{-4}$, preferably less than $1\times10^{-4}$ over a volume greater than 0.1 mm$^3$, preferably greater than 0.5 mm$^3$, preferably greater than 1 mm$^3$, preferably greater than 3.4 mm$^3$, preferably greater than 8 mm$^3$, preferably greater than 27 mm$^3$, preferably greater than 64 mm$^3$, preferably greater than 125 mm$^3$, preferably greater than 512 mm$^3$, preferably greater than 1000 mm$^3$. Birefringence may be characterized using, for example, Metripol® apparatus.

For an isotropic medium, such as stress-free diamond, the refractive index is independent of the direction of the polarization of light. If a diamond sample is inhomogeneously stressed, either because of grown-in stress or local defects or because of externally applied pressure, the refractive index is anisotropic. The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients.

Metripol® (Oxford Cryosystems) gives information on how the refractive index at a given wavelength depends on polarization direction in the plane perpendicular to the viewing direction. An explanation of how the Metripol® works is given by A. M. Glazer et al. in Proc. R. Soc. Lond. A (1996) 452, 2751-2765.

The Metripol® instrument determines the direction of the "slow axis", i.e. the polarization direction in the plane perpendicular to the viewing direction for which the refractive index is a maximum. It also measures $|\sin \delta|$ where $\delta$ is the phase shift given by $$\delta=(2\pi/\lambda)\Delta nL$$

where $\lambda$ is the wavelength of the light, L is the thickness of the specimen and $\Delta n$ is the difference between the refractive index for light polarized parallel to the slow and fast axes i.e. the birefringence. An L is known as the 'optical retardation'.

For retardation in first order, with L=0.6 mm and $\lambda$=589.6 nm, then: when $\sin \delta=1$ and $\Delta n$ L=$\lambda$/4, it can be deduced that $\Delta n=2.45\times10^{-4}$, when $\sin \delta=0.5$ and $\Delta n$ L=$\lambda$/12, it can be deduced that $\Delta n=0.819\times10^{-4}$.

Metripol® produces three colour-coded images showing the spatial variations of a) the "slow axis", b) $|\sin \delta|$ and c) the absorbance at the wavelength of operation.

Samples are prepared as optical plates of known thickness and analysed over an area of at least 1.3 mm×1.3 mm, and preferably 2.5 mm×2.5 mm, and more preferably 4 mm×4 mm. Metripol® $|\sin \delta|$ images are then analysed and the maximum value of $|\sin \delta|$ in each frame over the whole of the analysis area and use these values to characterise the maximum value of An can be calculated of the whole of the area analysed.

The behaviour of sine $\delta$ is the property of a particular plate of material, constrained here to plates of useful thickness by application of a minimum thickness. A more fundamental property of the material can be obtained by converting the sine $\delta$ information back to a value averaged over the thickness of the sample of the difference between the refractive index for light polarised parallel to the slow and fast axes, $\Delta n_{[average]}$.

Instrument resolution and noise sets a lower limit to the value of $|\sin \delta|$ and hence the retardation Delta-n.d measurable by Metripol®. This in turn sets a lower limit on the measurable birefringence, although the limit on this parameter depends on the specimen thickness. For illustration, if the lower limit on $|\sin$ delta$|$ is 0.03, for light of wavelength 550 nm, this corresponds to a lower limit on the measurable birefringence of $\Delta n=1.05\times10^{-5}$ for a sample of thickness 500 microns; or a lower limit on the measurable birefringence of $\Delta n=7.5\times10^{-7}$ for a sample of thickness 3500 microns.

Birefringence values may be determined in 3 orthogonal directions which effectively enable a volume measurement. This may be particularly important in some applications such as spherical optics etc. The limits defined below are calculated based on measurements and assuming a 3 mm path length.

Preferably, the methods of this invention provide for the fabrication of diamond material such that birefringence measurements in at least one, preferably two, preferably all three orthogonal directions show values of $\Delta n$ such that:

preferably $\Delta n$ is less than $2\times10^{-6}$ over areas greater than 1×1 mm, preferably over areas greater than 2×2 mm, preferably over areas greater than 4×4 mm, preferably over areas greater than 7×7 mm, preferably over areas greater than 15×15 mm;

preferably $\Delta n$ is less than $5\times10^{-6}$ over areas greater than 1×1 mm, preferably over areas greater than 2×2 mm, preferably over areas greater than 4×4 mm, preferably over areas greater than 7×7 mm, preferably over areas greater than 15×15 mm;

preferably $\Delta n$ is less than $1\times10^{-5}$ over areas greater than 1×1 mm, preferably greater than 2×2 mm, preferably greater than 4×4 mm, preferably greater than 7×7 mm, preferably greater than 15×15 mm.

Where birefringence values lie below a given threshold for each of three orthogonal directions of a particular volume of diamond, then for the purposes of this specification that volume is deemed to have a birefringence value below that threshold.

The present invention also provides a CVD diamond layer produced according to any of the methods outlined above for use as an optical element.

The present invention also provides a CVD diamond layer produced according to any of the methods outlined above for use as an electrical or electronic element. The present invention also provides a CVD diamond layer produced according to any of the methods above for use as a cutting tool or wire drawing die or other wear-resistant part.

The present invention also provides a CVD diamond layer produced according to any of the methods outlined above wherein the diamond layer has a thickness greater than 0.1 mm, preferably greater than 0.5 mm, preferably greater than 1 mm, preferably greater than 2 mm.

The present invention also provides a CVD single crystal diamond layer produced according to any of the methods outlined above wherein the diamond layer is in the form of a gemstone.

Preferably, the CVD single crystal diamond has three orthogonal dimensions greater than 2 mm, wherein at least one axis lies along the <100> crystal direction or along the principle symmetry axis of the gemstone. Preferably, the three orthogonal dimensions are greater than 2.5 mm, preferably greater than 3.0 mm, preferably greater than 3.5 mm. Preferably, the CVD single crystal diamond layer is of high clarity, with clarity of at least SI1 on the GIA gem grading scale, as defined above. Preferably, the CVD single crystal diamond layer has clarity of at least VS2, preferably at least VVS2, preferably at least VVS1 on the GIA gem grading scale.

The methods of the present invention may be used to produce CVD polycrystalline diamond, in which the detrimental effects of the presence of nitrogen, for example, can be ameliorated. In particular, the detrimental effect of having small amounts of nitrogen on the electronic properties of the polycrystalline diamond, such as charge collection efficiency and carrier lifetime, may be countered. In this way, because of the improvement in electronic properties, polycrystalline diamond containing nitrogen can be used as a detector. This has the advantage of enabling detectors to be made from polycrystalline diamond containing nitrogen rather than having to rely on "pure" polycrystalline diamond that is much more expensive to synthesise.

Polycrystalline CVD diamond produced by the methods of the present invention may be used as a material of low optical absorption in the far infra red part of the electromagnetic spectrum (used for, amongst other applications, the manufacture of long wave infra red optical components including laser exit windows and imaging domes for missiles). The use of the method of this invention may allow the manufacture of such components with better performance than is currently possible.

The polycrystalline diamond produced by the methods of the present invention may also be used as a material with low dielectric loss in the microwave part of the electromagnetic spectrum (used for, amongst other applications, exit windows for high powered gyrotrons) and as a material where the thermal conductivity is important (used in thermal management applications).

The diamond layer produced by any of the methods of the present invention is preferably of high crystalline quality. In relation to single crystal diamond "high crystalline quality" allows the presence of the impurity atoms and associated point defects but places limits on the presence of dislocation bundles or other extended defects which impact on the use of the material for optical applications, for example by causing excessive scattering, or colour, or reduction in strength or processability below that required for the intended optical application. In relation to polycrystalline diamond, "high crystalline quality" means that the material has a negligible content of non-diamond carbon and other defects in the grain boundaries.

Such defects have a significant impact on the usability of the material for optical and other applications and are, therefore, undesirable.

The present invention also provides a use of a sufficient quantity of a gaseous source comprising a second impurity atom type to counter the detrimental effect on colour of diamond of a first impurity atom type in a method of producing a CVD diamond layer having high colour, wherein high colour is as defined above. The preferred features relating to the gaseous sources and the first and second impurity atom types defined in relation to the first, second and third embodiments of the method of the present invention apply equally to this use.

The present invention also provides a use of a gaseous source of silicon for addition to a reaction chamber comprising a substrate and a diamond synthesis atmosphere such that the silicon counters the detrimental effect of a first impurity atom type in a method of CVD diamond production. The preferred features relating to the gaseous sources, silicon and the first impurity atom type defined in relation to the second embodiment of the method of the present invention apply equally to this use.

In all of the methods, diamond layers and uses provided by the present invention, there may exist additional impurities in the diamond layer produced. Preferably, the total concentration of any additional impurities (not including hydrogen) is less than 5 ppm, preferably less than 2 ppm, preferably less than 1 ppm, preferably less than 0.5 ppm, preferably less than 0.2 ppm. The concentration of any single additional impurity (not including hydrogen) in the diamond layer is 2 ppm or less, preferably 1 ppm or less, preferably 0.5 ppm or less, preferably 0.2 ppm or less, preferably 0.1 ppm or less.

According to the invention a method of producing 'high colour', as defined previously, low optical absorption single crystal CVD diamond includes the steps of providing a diamond substrate, providing a source gas including, or in the presence of, significant levels of one or more gaseous impurities, dissociating the source gas to produce a synthesis atmosphere that contains significant levels of the one or more gaseous impurities, and allowing homoepitaxial diamond growth on the diamond substrate.

By "low optical absorption" is meant that a material absorbs little in the visible spectrum. In particular, a diamond layer has low optical absorption if at least 50% of the diamond layer (the "majority volume") has an absorption coefficient which at all wavelengths between 300 and 1000 nm is less than 20 $cm^{-1}$. A diamond layer having low optical absorption may have an absorption coefficient at 270 nm of less than 2 $cm^{-1}$, and/or an absorption coefficient at 350 nm which is less than 1.5 $cm^{-1}$, and/or an absorption coefficient at 520 nm of less than 1 $cm^{-1}$. All absorption coefficients being measured at room temperature.

Preferably, the gaseous impurities (as defined below) are selected from the group consisting of N, B, Si, P and S, and in particular preferably at least include N.

In a preferred embodiment of the invention, the level of a first gaseous impurity, in particular nitrogen, is not optimal to alone enable production of the desired high colour, low optical absorption CVD diamond material of the invention. In this embodiment of the invention, the level of the first gaseous impurity in the synthesis atmosphere may be stable, at least to the extent of not exceeding an upper limit, or determined, and a second gaseous impurity is introduced into the synthesis atmosphere in a controlled manner, which second impurity is selected, and provided in a suitable amount, so as to reduce the effect on colour of the first impurity.

The second gaseous impurity is preferably selected from the group consisting of N, B, Si, S and P.

The single crystal CVD diamond material of the invention, in addition to being grown in a synthesis atmosphere having significant levels of gaseous impurities, itself may include significant levels of impurities whilst maintaining the desired high colour and low optical absorption characteristics.

In particular, the single crystal CVD diamond material of the invention preferably contains significant levels of one or more of the impurities N, B or Si, and in particular at least N.

The single crystal CVD diamond material of the invention preferably also has high clarity, in particular as defined herein.

The CVD diamond material is preferably grown on the surface of a diamond substrate that is substantially free of crystal defects.

The invention extends to high colour, low optical absorption, and preferably high clarity, single crystal CVD diamond containing significant levels of impurities in the crystal structure.

The single crystal CVD diamond of the invention is suitable for use in optical applications such as diamond windows, diamond lenses and anvils, and for shaping into a gemstone, and in particular a gemstone of high colour grade.

Applications to which the CVD diamond produced by the methods of the present invention may be put include optical applications, such as infra red transmission windows, and etalons where control of stress and minimisation of birefringence are important, knife blades, electronic components, such as Schottky diodes, and radiation detectors.

The methods of the invention described above provide for production of high colour, low optical absorption single crystal CVD diamond that is suitable for optical and gem applications. The methods of the invention described above also provide for production of high colour, low optical absorption polycrystalline CVD diamond. The CVD process is carried out in a synthesis atmosphere containing significant levels of one or more gaseous impurities, and in particular where one gaseous impurity present is nitrogen. The high colour, low optical absorption single crystal CVD diamond is suitable for use in optical and gem applications despite, or in certain instances because of, containing significant levels of one or more impurities, such impurities including nitrogen, silicon and boron. Certain properties of diamond often considered to be present in a particular form or to a particular extent in high quality high purity CVD diamond are also modified by the presence of the impurities in the growth process or incorporated into the diamond, and the invention further provides for the production of diamond material of high colour with these modified properties.

A particular example is the addition of silicon to a CVD diamond synthesis atmosphere containing nitrogen, which has been shown to increase the normalised FE intensity, and is thus anticipated to substantially improve other electronic properties toward the values which have been measured in the absence of nitrogen. Additionally, reduction in defects in the diamond due to reduced surface roughening during growth is anticipated to improve a number of other mechanical and chemical properties, including wear resistance and thermal stability. It is expected that thermal stability is particularly improved under conditions without stabilizing pressure, as might occur during annealing.

The diamond material of the invention advantageously has "high colour" and "low optical absorption", as defined previously.

Diamond of high colour can be characterised in a number of ways. The preferred and most definitive way for material used in a gem application is the preparation of a gemstone from the material, and characterisation of the colour of the gemstone. In particular, the invention provides for the production of material of a quality and size which will form a 0.5 ct CVD diamond gemstone, in the form of a round brilliant, which has a colour based on the natural diamond colour scale of better than K, and more preferably better than J, and more preferably better than 1, and more preferably better than H, and more preferably better than G, and more preferably better than F, and most preferably better than E. In this context 'better than' means a colour to the higher colour or lower absorption side, i.e. towards the side on which D colour stones would lie, and in the case of better than E colour refers to D colour or totally colourless diamond.

Throughout this application the colour of diamond refers to the Gemological Institute of America (GIA) colour scale, as described previously. The GIA colour scale runs from D to Z, and higher letters. 'High colour' is conventionally taken as being the range of colours at the low end of the alphabet, that is from D to better than K. The GIA colour scale is very widely used throughout the worldwide diamond industry [see 'Diamond Grading ABC', V. Pagel-Theisen, $9^{th}$ Edition, 2001, pages 61 and 64-83 for an explanation of how the colour is determined]. In essence, the colour grade is determined by comparing the diamond against diamond standards of previously determined colour. The use of the term 'colourless' to describe the colour of a diamond seems anomalous, but 'colourless' refers to the detection threshold of the unaided or slightly-aided human eye: optical instruments such as spectrometers are able to detect absorption features that give rise to colour in diamond at concentrations far below that at which they become perceptible to the human eye as a colour. Thus it is entirely reasonable to consider a diamond perceived to be colourless by the human eye to have a position on a colour scale.

The reference to a particular size of gemstone in this definition of colour is necessary to properly identify the colour of a diamond material, since for the same optical absorption coefficients a larger gemstone has a lower colour grade. However, it is to be understood that this reference to a size of gemstone does not restrict the invention to gemstones of any particular size or cut. Where the material is in the form of a different size and/or cut of gemstone, or cannot be produced in the form a gemstone, and more preferably a round brilliant cut gemstone, suitable methods of colour calculation of the equivalent round brilliant cut colour are herein provided.

For other optical applications, the key parameter is generally the optical absorption coefficient, across the optical range of interest in the application. In particular, the absorption coefficients of the diamond at the wavelengths 270 nm, 350 nm, and 500 nm are of particular relevance, being generated by the defects arising from common impurities under normal process conditions and often playing a significant role on the colour of the material or the absorptions which may limit its use. Thus the CVD diamond material of the invention described above will also preferably have one, more preferably two, more preferably three, and most preferably all of the following characteristics (i), (ii), (iii), (iv), observable in the optical absorption spectrum:
  i) an absorption coefficient measured at room temperature at all wavelengths between 300 and 1000 nm which is less than 2 $cm^{-1}$, more preferably less than 1 $cm^{-1}$, even more preferably less than 0.5 $cm^{-1}$, and most preferably less than 0.2 $cm^{-1}$;
  ii) an absorption coefficient at 270 nm which is less than 2 $cm^{-1}$, more preferably less than 1 $cm^{-1}$, even more preferably less than 0.5 $cm^{-1}$, and most preferably less than 0.2 $cm^{-1}$;
  iii) an absorption coefficient at 350 nm which is less than 1.5 $cm^{-1}$, more preferably less than 0.75 $cm^{-1}$, even more preferably less than 0.3 $cm^{-1}$, and most preferably less than 0.15 $cm^{-1}$;
  iv) an absorption coefficient at 520 nm which is less than 1 $cm^{-1}$, more preferably less than 0.5 $cm^{-1}$, even more preferably less than 0.2 $cm^{-1}$, and most preferably less than 0.1 $cm^{-1}$.

The CVD diamond material of the invention described above will also preferably have one, more preferably two, more preferably three, more preferably four, and most preferably all of the following characteristics (1), (2), (3), (4), (5) observable in the majority volume of the layer, where the majority volume comprises at least 50%, preferably at least 55%, preferably at least 60%, preferably at least 70%, preferably at least 80%, preferably at least 90% and most preferably at least 95% of the whole volume of the layer:
  1) a charge collection distance of less than 150 μm, preferably less than 100 μm, more preferably less than 50 μm, even more preferably less than 20 μm, even more preferably less than 10 μm, and most preferably less than 5 µm, all charge collection distances being measured at an applied field of 1 V/µm and at 300 K. Alternatively, a charge collection distance of greater than 100 µm, preferably greater than 150 µm, preferably greater than 200 µm, preferably greater than 300 µm, preferably greater than 500 µm, preferably greater than 1000 µm. (Although most applications benefit from a high charge collection distance, some applications requiring very high speed detectors benefit from low charge collection distances, particularly in combination with the high crystal quality obtainable using a preferred method of the invention);

2) a level of at least one impurity (excluding hydrogen) greater than 0.05 ppm, more preferably greater than 0.1 ppm, more preferably greater than 0.2 ppm, more preferably greater than 0.5 ppm, more preferably greater than 1 ppm, more preferably greater than 2 ppm, even more preferably greater than 5 ppm, and most preferably greater than 10 ppm. (Impurity concentrations can for example be measured by secondary ion mass spectroscopy (SIMS), glow discharge mass spectroscopy (GDMS) or combustion mass spectroscopy (CMS), electron paramagnetic resonance (EPR) and IR (infrared) absorption. In addition the uncompensated single substitutional nitrogen concentration can be determined from the peak of the absorption feature at 270 nm after baseline subtraction (calibrated against standard values obtained from samples destructively analysed by combustion analysis));

3) a total impurity concentration (excluding hydrogen) of greater than 0.2 ppm, more preferably greater than 0.5 ppm, even more preferably greater than 1 ppm, even more preferably greater than 2 ppm, even more preferably greater than 5 ppm, even more preferably greater than 10 ppm, and most preferably greater than 20 ppm. (Impurity concentrations may be measured as above);

4.1) weak free exciton luminescence in the cathodoluminescence spectrum measured at 77 K, with the integrated intensity of the free exciton luminescence preferably not exceeding 0.5, more preferably not exceeding 0.2, even more preferably not exceeding 0.1, and most preferably not exceeding 0.05 of the integrated free exciton luminescence intensity for a homoepitaxial CVD diamond sample grown under high purity conditions, for example those revealed in WO 01/96634. Alternatively, a strong free exciton luminescence in the cathodoluminescence spectrum measured at 77 K, with the integrated intensity of the free exciton luminescence preferably exceeding 0.5, preferably exceeding 0.6, preferably exceeding 0.7, preferably exceeding 0.8, preferably exceeding 0.9 of the integrated free exciton luminescence intensity for a homoepitaxial CVD diamond sample grown under high purity conditions; or 4.2) the strength of free exciton emission excited by 193 nm ArF excimer laser at room temperature is such that the quantum yield for free exciton emission is less than $10^{-4}$, more preferably less than $10^{-5}$, and more preferably less than $10^{-6\,4}$. Alternatively, the free exciton emission is greater than $10^{-6}$, preferably greater than $10^{-5}$, preferably greater than $10^{-4}$. Free exciton emission can also be excited by above-bandgap radiation, for example by 193 nm radiation from an ArF excimer laser. The presence of strong free exciton emission in the photoluminescence spectrum excited in this way indicates the substantial absence of dislocations and impurities;

5) in EPR, a spin density which at g=2.0028 exceeds $1 \times 10^{16}$ atoms $cm^{-3}$, more preferably exceeds $2 \times 10^{16}$ atoms $cm^{-3}$, more preferably exceeds $5 \times 10^{16}$ atoms $cm^{-3}$, more preferably exceeds $1 \times 10^{17}$ atoms $cm^{-3}$, more preferably exceeds $2 \times 10^{17}$ atoms $cm^{-3}$, and most preferably exceeds $5 \times 10^{17}$ atoms $cm^3$. Alternatively, the spin density is preferably less than $5 \times 10^{17}$ atoms $cm^{-3}$, preferably less than $2 \times 10^{17}$ atoms $cm^{-3}$, preferably less than $1 \times 10^{17}$ atoms $cm^{-3}$, preferably less than $5 \times 10^{16}$ atoms $cm^{-3}$, preferably less than $2 \times 10^{16}$ atoms $cm^{-3}$, preferably less than $1 \times 10^{16}$ atoms $cm^{-3}$. (In single crystal diamond this line is related to lattice defect concentrations and is typically large in poor quality homoepitaxial diamond but small in high colour CVD diamond formed using a high purity growth process).

Preferably the majority volume of the layer is formed from a single growth sector.

A key to the methods of this invention described above is that growth takes place in a CVD reactor using a gas mixture containing at least one gaseous impurity, and more preferably containing at least two gaseous impurities. The preferred method of the invention is where the presence of at least one gaseous impurity arises at least in part without deliberate addition, but because of the difficulty or cost of reducing its level further by processing of the source gases or modification to the vacuum environment, and where a second impurity is deliberately added or made available to the process in order to ameliorate the effects of the first impurity. In this specification, a gaseous impurity is any element, other than carbon, whose normal elemental state at room temperature and pressure is a solid but which can adopt a gaseous form and can be added, or otherwise be present, as a gas in a process gas mixture, or can be transferred within the process through gaseous form for example from the walls of the reactor or from other solid elements within the reactor volume, where that element can either (i) be incorporated into the diamond lattice, or (ii) can interact with the growth surface of the diamond and modify the quality of the diamond formed, or (iii) interact with other gaseous species present in the process so as to affect the outcome of the process.

In the preferred method of the invention described above where one gaseous impurity arises at least in part without deliberate addition, its concentration in the process is generally such that, if present as the sole gaseous impurity, it would be incorporated into the diamond lattice or interact with the growth surface of the diamond, or interact with other gaseous species present in the process so as to significantly affect the outcome of the process, and particularly degrade the colour or increase the optical absorption of the material. The definition of gaseous impurities specifically excludes the noble gases, the halogens, oxygen and hydrogen, and specifically includes elements such as B, P, S, Si etc. In addition, as a specific and sole exception to the condition that the elemental state of the impurity is a solid at room temperature, nitrogen in any form (e.g. $N_2$, $NH_2$) is also considered a gaseous impurity in this specification.

In particular, the presence of nitrogen is known to affect growth processes. Previously the production of high purity diamond, or colourless diamond showing the electronic properties described in WO 01/96634 has required the control of nitrogen levels to less than 300 ppb. Within this specification, nitrogen above 300 ppb (measured as $N_2$, or the equivalent for other forms of nitrogen such as $NH_3$) is thus a gaseous impurity.

Thus the methods of this invention described above provide means for the production of high colour diamond from a growth process containing a concentration of nitrogen greater than 300 ppb, more preferably greater than 500 ppb, even more preferably greater than 1 ppm, even more preferably greater than 2 ppm, even more preferably greater than 5 ppm, even more preferably greater than 10 ppm, and most preferably greater than 20 ppm or even higher.

As mentioned previously, it is preferred that at least nitrogen is present in the synthesis atmosphere as a gaseous impurity. In this regard, the methods of this invention described above can be used in two distinct ways, the first where the level of nitrogen is carefully controlled, and the second preferred method is where the level of nitrogen is only controlled to the extent of keeping it below some threshold which is significantly higher than is normally required for the production of high colour diamond.

In the first method in which nitrogen is carefully controlled, the prime benefit of this is where the uncontrolled impurity is other than nitrogen, and nitrogen can be used to reduce its effect. For example boron contamination in a CVD chamber is very persistent, and even at low levels boron can add a significant blue colour to the diamond synthesised. However, careful control of nitrogen additions (in the form of $N_2$ or any other N containing gas) can be used to compensate this boron and reduce its effect on the colour of the diamond. In addition, there may be an effect whereby the added nitrogen also modifies and in particular reduces the amount of boron taken up into the solid. Those skilled in the art will appreciate this technique could be applied to contaminants other than boron.

However, a preferred method of the invention described above deals with the more common problem of nitrogen which is present at levels above those normally required for synthesis of high colour diamond. For example the choice may be to use process gases which contain significant nitrogen impurity levels, or the process chamber may have a small leak, or nitrogen may enter the process by other means. In such cases the reduction of the nitrogen level may be costly.

By careful addition of selected gaseous impurities to the gas phase of the growth process, whereby these impurities may affect the growth process, and themselves may be incorporated into the diamond, it is possible to reduce the impact of the nitrogen present in the growth process on the colour of the diamond produced. In particular the benefit on the colour may result from the incorporation of the deliberately added impurity which may compensate the nitrogen, or it may reduce the uptake of the nitrogen during growth, or it may simply reduce the deleterious effect of the nitrogen on the colour of the diamond, or it may provide a combination of these effects.

Accordingly, a particularly preferred embodiment of the method of this invention described above includes the controlled addition of a gaseous impurity that modifies the effect that nitrogen has on the growth process and/or the resultant colour of the diamond, and in particular reduces the optical absorption of the diamond below that which would occur if nitrogen was present as the sole gaseous impurity, thus improving its colour. This gaseous impurity can be any one of B, Si, S, P, but is not restricted to this list. More preferably this gaseous impurity is B or Si, and most preferably Si.

Thus, one such selected impurity is boron, which may be added into the gas phase in the form of diborane for example. In the presence of boron, nitrogen uptake may be reduced depending on precise concentrations and growth conditions, and the boron may compensate the nitrogen that is taken up. In addition, the boron appears to reduce the deleterious effects of nitrogen that is taken up on the colour of the diamond. One difficulty with boron is that too much boron will colour the diamond blue, so the level of boron needs to be optimised for the level of nitrogen and carefully controlled.

As is generally well known, the incorporation ratio for nitrogen in CVD diamond growth is generally much lower than that for boron. As a consequence, when the objective is to achieve a degree of balance to the levels of nitrogen and boron incorporated into the solid to achieve compensation, the level of boron added to the gas phase is likely to be much lower than the level of nitrogen present, and is preferably less by a factor of 10, more preferably is less by a factor of 30, and most preferably less by a factor of 100. In view of the need to balance the boron with the nitrogen, at least to a degree, this method works best and is thus preferred when the final object produced from the material is confined to a single diamond growth sector, since the relative uptake of impurities varies between growth sectors.

The deliberately added boron, for example in the form of diborane or some other boron containing gas, is preferably provided in concentrations greater than 0.5 ppb (parts per billion, or molecules of diborane per $10^9$ molecules present in the gas phase, as present in the incoming gas stream before dissociation), more preferably greater than 1.0 ppb, more preferably greater than 2 ppb, more preferably greater than 5 ppb, more preferably greater than 10 ppb, more preferably greater than 20 ppb, more preferably greater than 50 ppb, and most preferably greater than 0.1 ppm.

When nitrogen is present as an impurity in the process, a particularly preferred impurity to deliberately add to the process to improve the colour is silicon. Silicon when present is known to be taken up into diamond and particularly in the presence of nitrogen is known to form the 737 nm luminescent centre. This centre does not impact on the visible colour of the diamond. However this invention discloses that silicon added to the gas phase in suitable concentrations, for example in the form of silane, can cause a dramatic reduction in the effect that any nitrogen present as a gaseous impurity has on the colour of the diamond. The mechanism may be one of reducing nitrogen uptake or simply reducing the defect centres that nitrogen uptake normally generates, or there may be compensation effects, although this would be surprising with silicon as it has not previously been reported as a p-type dopant in diamond. However, in the case of silicon, there is much greater latitude to add additional silicon over the minimum required for the beneficial effect on colour without any detrimental effect on the colour being observed, making the process easier to apply than with boron. The use of silicon is thus preferred over the use of boron. In particular, there is less need to restrict product to material from a single growth sector, since sufficient Si can be added until all growth sectors required are free of colour to the extent required.

The precise concentration of silicon dopant required to achieve this effect will in part be dependent on the other process conditions such as process power, pressure, substrate temperature etc. but those skilled in the art will be able to adapt the conditions provided herein to their own particular synthesis system without undue difficulty.

The deliberately added silicon, for example in the form of silane or some other silicon containing gas, is preferably provided in concentrations greater than 0.01 ppm (parts per million or parts per $10^6$, equivalent silane molecules: all gas molecules present in the incoming gas stream before dissociation), more preferably greater than 0.03 ppm, more preferably greater than 0.1 ppm, more preferably greater than 0.2 ppm, more preferably greater than 0.5 ppm, more preferably greater than 1 ppm, more preferably greater than 2 ppm, more preferably greater than 5 ppm, more preferably greater than 10 ppm, and most preferably greater than 20 ppm.

The CVD diamond material itself preferably includes significant levels of one, or preferably more than one, impurity where the impurity or impurities may be one or more of the following:

a) boron in the solid phase at a concentration greater than $10^{14}$ atoms $cm^{-3}$, preferably greater than $3\times10^{14}$ atoms $cm^{-3}$, preferably greater than $10^{15}$ atoms $cm^{-3}$, more preferably greater than $3\times10^{15}$ atoms $cm^{-3}$, more preferably greater than $10^{16}$ atoms $cm^{-3}$, more preferably greater than $3\times10^{16}$ atoms $cm^{-3}$, and most preferably greater than $10^{17}$ atoms $cm^{-3}$;
b) silicon in the solid phase at a concentration greater than $10^{14}$ atoms $cm^{-3}$, preferably greater than $3\times10^{14}$ atoms $cm^{-3}$, preferably greater than $10^{15}$ atoms $cm^{-3}$, more preferably greater than $3\times10^{15}$ atoms $cm^{-3}$, more preferably greater than $10^{16}$ atoms $cm^{-3}$, more preferably greater than $3\times10^{16}$ atoms $cm^{-3}$, and most preferably greater than $10^{17}$ atoms $cm^{-3}$;
c) nitrogen in the solid phase at a concentration greater than $5\times10^{15}$ atoms $cm^{-3}$, preferably greater than $10^{16}$ atoms $cm^{-3}$, more preferably greater than $3\times10^{16}$ atoms $cm^{-3}$, most preferably greater than $10^{17}$ atoms $cm^{-3}$. Preferably the nitrogen is present alongside at least one further impurity, that further impurity more preferably being B or Si and fulfilling the criteria for boron and silicon above, and most preferably being Si and fulfilling the criteria for silicon above. Although nitrogen at these levels is known in CVD diamond, it is not known in combination with high colour, and in particular in high colour gemstones of high clarity and significant size.

Those skilled in the art will understand that embodiments of the method described above can in principle be applied to many other combinations of impurities in diamond, for example boron and sulphur or boron and phosphorus, or silicon and sulphur, or silicon and phosphorus, but that the presence of one of these impurities as an uncontrolled impurity in the growth process affecting colour is much less common.

Since the deliberately added impurity may reduce the uptake of the uncontrolled impurity, it may be possible to improve the electronic properties of the resultant material over that which would be achieved without the deliberately added dopant, but these will not normally exceed those obtainable from high purity processes such as that disclosed in WO 01/96634. In this context improved electronic properties may include increased mobilities, lifetimes, charge collection distance and the like.

The diamond layer of the invention described above is preferably of "high crystalline quality". In this context "high crystalline quality" allows the presence of the impurity atoms and associated point defects, but places limits on the presence of dislocation bundles or other extended defects which impact on the use of the material for optical applications, for example by causing excessive scattering, or colour, or reduction in strength or processability below that required for the intended optical application.

A further aspect of the invention described above is that the high colour CVD diamond of the invention may be prepared in the form of a gemstone. Such gemstones may be of high quality. In gem quality grading, one of the four key quality parameters is the clarity of the diamond gemstone. The clarity grades used are generally those defined by the GIA (Gemological Institute of America) and run on a scale from FL (flawless), IF, VVS1 (very very slightly included), VVS2, VS1 (very slightly included), VS2, SI1 (slightly included), SI2, I1 (imperfect), I2 and I3. Clarity is the absence of visible flaws in the gemstone, and it is common in CVD diamond growth processes using poor substrate preparation and/or impure process gases to generate inclusions or other features in the diamond which degrade the clarity.

High clarity is very desirable in gemstones, particularly in combination with high colour, but no method of producing high colour and high clarity material in the presence of significant impurities in the process or in the subsequent material has previously been known. In particular, the method of this invention provides for material of high colour, grown in a process with significant gaseous impurities present, and in a preferred embodiment containing in the solid significant levels of one or more of those gaseous impurities, where the clarity is better than I1, more preferably is better than SI1, more preferably is better than VS2, more preferably is better than VS1, more preferably is better than VVS2, more preferably is better than VVS1, and most preferably is flawless.

The invention described above provides CVD single crystal diamond material in the form of a layer of high colour, low optical absorption, and preferably also high clarity, diamond that has a thickness preferably greater than 0.1 mm, more preferably greater than 0.2 mm, more preferably greater than 0.5 mm, more preferably greater than 1 mm, more preferably greater than 2 mm, even more preferably greater than 2.5 mm, even more preferably greater than 3 mm, and most preferably greater than 3.5 mm, where the layer contains significant impurities or was grown in the presence of significant gaseous impurities.

The invention described above further provides a CVD diamond produced from a single crystal CVD layer described above polished in the form of a gemstone characterised by having three orthogonal dimensions greater than 2 mm, and preferably greater than 2.5 mm, and more preferably greater than 3.0 mm, where at least one axis lies either along the <100> crystal direction or along the principle symmetry axis of the stone. The diamond will be of high quality and may have one or more of the characteristics identified above.

It is important for the production of the uniformly high colour single crystal CVD diamond material of this invention described above that growth takes place on a diamond surface which is substantially free of crystal defects. In this context, defects primarily mean dislocations and micro cracks, but also include twin boundaries, point defects, low angle boundaries and any other disruption to the crystal structure. Preferably the substrate is a low birefringence type Ia natural, Ib or IIa high pressure/high temperature synthetic diamond or a CVD synthesised single crystal diamond. Defects can degrade the material in two ways, generating stress, cracking and associated preferred sites for colour defect formation, and adversely affecting the local uptake of impurities. Since dislocation multiplication occurs during the growth of thick layers, the control of dislocations within the substrate and early stages of growth is particularly important.

The defect density is most easily characterised by optical evaluation after using a plasma or chemical etch optimised to reveal the defects (referred to as a revealing plasma etch), using for example a brief plasma etch of the type described below. Two types of defects can be revealed:
1) Those intrinsic to the substrate material quality. In selected natural diamond the density of these defects can be as low as $50/mm^2$ with more typical values being $10^2/mm^2$, whilst in others it can be $10^6/mm^2$ or greater.
2) Those resulting from polishing, including dislocation structures and microcracks forming chatter tracks (sometimes known as clatter tracks) along polishing lines. The density of these can vary considerably over a sample, with typical values ranging from about $10^2/mm^2$, up to more than $10^4/mm^2$ in poorly polished regions or samples.

The preferred low density of defects is such that the density of surface etch features related to defects, as described above, is below $5 \times 10^3/mm^2$, and more preferably below $10^2/mm^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised to yield low defect levels), and less conventional techniques such as laser processing or ion implantation and lift off techniques, chemical/mechanical polishing, and both liquid and plasma chemical processing techniques. In addition, the surface $R_Q$ (root mean square deviation of surface profile from flat measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because this avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes;

(ii) a hydrogen etch which is similar to (i) but where the oxygen is absent;

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moves directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma into the gas phase or to the substrate surface. The hydrogen etch following the oxygen etch is less specific to crystal defects, rounding off the angularities caused by the oxygen etch which aggressively attacks such defects and providing a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations up to 5°, and in some cases up to 10°, although this is less desirable as it adversely affects reproducibility.

The methods of this invention described above can be further combined with post growth treatment, such as annealing. In this context annealing can occur over a range of temperatures and pressures, from near atmospheric annealing at temperatures as low as 1000° C.-1800° C., and high pressure annealing in the graphite or diamond stable regions at temperatures in the range 1200° C.-3000° C.

There are three visual attributes to colour: hue, lightness and saturation. Hue is the attribute of colour that allows it to be classified as red, green, blue, yellow, black or white, or a hue that is intermediate between adjacent pairs or triplets of these basic hues (Stephen C. Hofer, Collecting and Classifying Coloured Diamonds, 1998, Ashland Press, New York).

White, grey and black objects are differentiated on a lightness scale of light to dark. Lightness is the attribute of colour that is defined by the degree of similarity with a neutral achromatic scale starting with white and progressing through darker levels of grey and ending with black.

Saturation is the attribute of colour that is defined by the degree of difference from an achromatic colour of the same lightness. It is also a descriptive term corresponding to the strength of a colour. The diamond trade uses adjectives such as intense, strong and vivid to denote different degrees of saturation assessed visually. In the CIELAB colour system, saturation is the degree of departure from the neutral colour axis (defined by saturation=$[(a^*)^2+(b^*)^2]^{1/2}$, see hereinafter). Lightness is a visual quality perceived separately from saturation.

In cases where material with particular absorption properties has been grown to a limited thickness, it is useful to be able to predict, from absorption spectroscopy measurements carried out on a thin parallel-sided plate of the material, what colour a round brilliant would be if it were polished from a thicker slab of uniform material with the same absorption coefficient spectrum. A simple routine for doing this is described here. The first stage of this routine is the derivation of CIELAB chromaticity coordinates for a parallel sided plate of material from its measured transmittance in the visible region of the spectrum.

The perceived colour of an object depends on the transmittance/absorbance spectrum of the object, the spectral power distribution of the illumination source and the response curves of the observer's eyes. The CIELAB chromaticity coordinates quoted in this specification have been derived in the way described below.

Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum (between 350 nm and 800 nm with a 1 nm data interval) using the relationships below.

$S_\lambda$=transmittance at wavelength $\lambda$
$L_\lambda$=spectral power distribution of the illumination
$x_\lambda$=red response function of the eye
$y_\lambda$=green response function of the eye
$z_\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0 = \Sigma_\lambda y_\lambda L_\lambda$ $L^* = 116(Y/Y_0)^{1/3} - 16 =$ Lightness (for $Y/Y_0 > 0.008856$)

$a^* = 500[(X/X_0)^{1/3} - (Y/Y_0)^{1/3}]$ (for $X/X_0 > 0.008856$, $Y/Y_0 > 0.008856$)

$b^* = 200[(Y/Y_0)^{1/3} - (Z/Z_0)^{1/3}]$ (for $Z/Z_0 > 0.008856$)

$C^* = (a^{*2} + b^{*2})^{1/2} =$ saturation $h_{ab} = \arctan(b^*/a^*) =$ hue angle Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is normal to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness. In this way the dependence of the hue, saturation and lightness on optical path length can be modelled to give an understanding of how the colour of diamond with given absorption properties per unit thickness will depend on the optical path length.

Much CVD material is brown because of a gradual rise in absorption coefficient towards shorter wavelengths. CVD synthetic round brilliants have generally been produced from homoepitaxial CVD material with an orientation such that the table of the polished stone is parallel to the interface with the diamond substrate on which CVD material was deposited. After substrate removal and polishing of the top and bottom faces of the resulting slab, absorbance/transmittance spectra have been collected and saturation values determined in the way described above. On polishing round brilliants with the depth limited by the thickness of such slabs (a 'depth-limited round brilliant'), an approximately linear relationship has been found between the modelled saturation for the parallel-sided slab and the numerical colour grade of the resulting finished stone, derived from GIA grades judged by a trained diamond grader using the following transformation: D=0, E=1, F=2, G=3, H=4 etc. For moderate to weak saturations, the empirical relationship between numerical colour grade of brown/brownish depth-limited CVD round brilliants and the saturation (C*) modelled from the absorbance/transmittance spectrum of the slab has been found to obey the following approximate relationship:

Round brilliant numerical colour grade = $2 \times C^*$.

The observed linearity is supported by the following argument. Colour modelling work has indicated that, for material with given absorption properties, for low to moderate saturations, there is an approximately linear relationship between the path length and C* values derived from absorbance/transmittance spectra using the routine outlined above. With given viewing and lighting conditions, the average path length for light reaching a viewer's eye from a round brilliant should be proportional to the linear dimensions of the stone. It follows from that there should be an approximately linear relationship between the saturation for a parallel-sided slab and the saturation for a depth-limited round brilliant produced from the slab. Previous work has suggested that there is an approximately linear relationship between the colour grade of a polished stone and its saturation. Taken together, this suggests that there should be an approximately linear relationship between the colour grade of a depth limited round brilliant and the saturation derived from the absorbance/transmittance spectrum of the parallel-sided slab from which it was polished.

From the discussion above it should be clear that where a relatively thin plate is produced, it is possible to predict, from absorbance/transmittance spectra measured for the plate, what colour a round brilliant would be if it were polished from a thicker slab of uniform material with the same absorption coefficient spectrum. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness (for example, approximately 3.2 mm for a 0.5 ct round brilliant or 3.8 mm for a 1 ct round brilliant). When subtracting the reflection loss, it is important to take account of the spectral dependence of the reflection coefficient. This can be derived from the wavelength dependence of the refractive index of diamond given by F. Peter in Z. Phys. 15, 358-368 (1923). Using this and standard formulae for the dependence of reflection loss for a parallel-sided plate on the refractive index, the effect of reflection losses on the apparent absorbance can be calculated as a function of wavelength and subtracted from measured spectra to allow absorption coefficient spectra to be calculated more accurately.

The invention will now be described with reference to the following non-limiting examples. In each of these examples, except where explicitly stated otherwise, in order to control nitrogen and thus characterise the utility of the invention, nitrogen was removed from the incoming gas stream by use of purifiers and high purity gas sources, such that without deliberate addition of a nitrogen dopant source the gas stream contained less than 100 ppb $N_2$. Nitrogen was then added back into the process using typically a mixture of 100 ppm $N_2$ in hydrogen, this gas mixture giving good control of nitrogen levels in the process gases, particularly in the range of 0.5-20 ppm. Those skilled in the art will appreciate that use of lower purity gases or poorer vacuum practice can easily result in nitrogen impurity levels in the process, particularly in the range 1-20 ppm or greater, and in such cases the nitrogen would not be a deliberately added impurity, but one present due to poorer control or cost savings.

EXAMPLE 1

Ib HPHT substrates suitable for synthesising single crystal CVD diamond were prepared according to the method described in WO 01/96634, with {100} major faces.

These substrates were brazed onto a tungsten substrate using a high temperature diamond braze material. This was introduced into a microwave plasma CVD reactor and an etch and growth cycle commenced in the general form described in WO 01/96634, but using the specific synthesis conditions described below.

Nitrogen was added into the process using a mixture of 100 ppm $N_2$ in hydrogen. Boron impurities were added to the process using either 20 ppm or 100 ppm $B_2H_6$ in hydrogen.

Two sets of samples were prepared.

Sample Set 1-1

The first stage of growth comprised 200/250/4500 sccm (standard cubic centimetre per minute) of $CH_4/Ar/H_2$ at $200\times10^2$ Pa and a substrate temperature of 850° C. with no added dopants. This was a control layer of high purity high colour growth to demonstrate process control.

The second stage of growth was the same as the first stage above with the addition of 1 ppm of $N_2$. This stage was to evaluate the effect of 1.0 ppm nitrogen as the sole gaseous impurity.

Sample Set 1-2

The first stage of growth repeated the conditions for the first stage of growth for set 1-1.

The second stage of growth was the same as the first stage above with the addition of 0.003 ppm $B_2H_6$, and the addition of 1 ppm $N_2$.

On completion of the growth period, the samples where removed from the reactor and processed to produce a range of test pieces, in particular cross-sectional slices of the growth, and free standing plates of the second stage growth layer which were typically 2-3 mm thick. The cross-sectional slices confirmed that the first stage growth in each case was essentially colourless high purity growth, and that whilst the second stage growth in sample set 1-1 was significantly coloured brown the second stage growth in the second process with added boron was almost colourless.

A number of further samples were produced, using the general growth conditions of: 200/250/4500 sccm (standard cubic centimetre per minute) of $CH_4/Ar/H_2$ at $200\times10^2$ Pa and a substrate temperature of 850° C., with the addition of 0.003 ppm $B_2H_6$, and the addition of 1 ppm $N_2$, but making small variations to the different growth parameters and in particular varying the temperature by +/-100° C., the relative ratio of the B and N concentration by a factor of 5 in both directions (e.g. higher and lower boron relative to nitrogen), and the pressure by +/-$100\times10^2$ Pa. The conclusion was that too much B relative to nitrogen produced blue material, that too little B relative to nitrogen produced brown material, and that the optimum balance between B and N varied to some degree with other process parameters such as pressure and temperature. However, the deleterious effect of the nitrogen in producing brown coloured or optically absorbing diamond could be ameliorated and largely stopped by adding an optimal level of boron to the process, matched to the particular growth conditions used.

EXAMPLE 2

Ib HPHT diamond substrates were prepared and mounted onto a tungsten disc as in example 1. This disc was introduced into a microwave plasma CVD reactor and an etch and growth cycle commenced in the general form described in WO 01/96634, but using the specific synthesis conditions described below.

Nitrogen was added into the process using a mixture of 100 ppm $N_2$ in hydrogen. Silicon impurities were added to the process using typically 500 ppm $SiH_4$ in hydrogen.

Two sets of samples were prepared.

Sample Set 2-1

The first stage of growth comprised 36/0/600 sccm (standard cubic centimetre per minute) of $CH_4/Ar/H_2$ at $250\times10^2$ Pa and a substrate temperature of 810° C. with no added dopants. This was a control layer of high purity high colour growth to demonstrate process control.

The second stage of growth was the same as the first stage above with the addition of 2.0 ppm of nitrogen. This stage was to evaluate the effect of 2.0 ppm nitrogen as the sole gaseous impurity.

Sample Set 2-2

The first stage of growth repeated the conditions for the first stage of growth for set 2-1.

The second stage of growth was the same as the first stage above with the addition of 0.3 ppm of silane, and the addition of 2.0 ppm of nitrogen.

On completion of the growth period, the samples where removed from the reactor and processed to produce a range of test pieces, in particular cross-sectional slices of the growth, and free standing plates of the second stage growth layer which were typically 2-3 mm thick. The cross-sectional slices confirmed that the first stage growth in each case was essentially colourless high purity growth, and that whilst the second stage growth in sample set 2-1 was significantly coloured brown the second stage growth in the second process with added silicon (set 2-2) was almost colourless.

A number of further samples were produced, using the general growth conditions of: 36/0/600 sccm (standard cubic centimetre per minute) of $CH_4/Ar/H_2$ at $250\times10^2$ Pa and a substrate temperature of 810° C., with the addition of silane in the range 0-5 ppm, and the addition of nitrogen in the range of 0-10 ppm, and also making small variations to the different growth parameters and in particular varying the temperature by +/-100° C., and the pressure by +/-$100\times10^2$ Pa. In particular the following combinations were tested, recording silane/nitrogen concentrations in ppm of: 0.2:1, 1:1, 5:10. In each case the effect of the silane was to suppress any brown colouration in the diamond which would otherwise have arisen. In addition, excess silicon over that needed to suppress the brown colouration did not generate any deleterious colour or other changes in the diamond growth. This provides an additional advantage of the use of Si as a gaseous impurity over that of B in terms of reducing the deleterious effect on nitrogen, since the concentration of the silane is not critical, and the level of nitrogen concentration in the gas phase or the precise value of other process parameters becomes much less important.

EXAMPLE 3

Ib HPHT diamond substrates were prepared and mounted onto a tungsten disc as in example 1. This disc was introduced into a microwave plasma CVD reactor and an etch and growth cycle commenced in the general form described in WO 01/96634, but using the following specific synthesis conditions:

The growth conditions were 36/0/600 sccm (standard cubic centimetre per minute) of $CH_4/Ar/H_2$ at $250\times10^2$ Pa and a substrate temperature of 810° C., with a silane concentration of 0.25 ppm and nitrogen concentration of 2 ppm. Growth was continued until the thickness of the CVD layers was 2 mm. After termination of the growth process the samples were removed and one was processed to produce a free-standing parallel-sided plate of single-crystal CVD diamond. Another was processed to produce a {100} cross-sectional slice. Characterisation of the free-standing CVD plate gave the following results:

a) SIMS measurements carried out in four places on each side of the plate indicated a uniform Si concentration of approximately $6\times10^{15}$ $cm^{-3}$ (34 ppb).

b) UV/visible/NIR absorption spectroscopy measurements carried out at room temperature indicated that the absorption coefficient was less than 0.15 cm$^{-1}$ for all wavelengths between 300 nm and 1000 nm. The absorption coefficient at 270 nm was 0.19 cm$^{-1}$ and, after baseline subtraction, the peak absorption coefficient of the 270 nm feature was 0.036 cm$^{-1}$, indicating a concentration of uncompensated nitrogen of approximately 24 ppb. The absorption coefficients at 350 nm and 520 nm were 0.10 and 0.07 cm$^{-1}$; respectively.

c) The CIELAB chromaticity coordinates for a 0.5 ct round brilliant produced from material of this kind were estimated from the absorption spectroscopy data using the method described earlier and were found to be:

$L^*=87.9, a^*=-0.13, b^*=1.07, C^*=1.08$

Using the method described earlier, it can be deduced that a stone with these chromaticity coordinates would have an F GIA colour grade.

d) Absorption spectroscopy carried out at 77 K indicated a strong 737 nm feature with an integrated absorption coefficient of 6.02 meV·cm$^{-1}$.

e) Photoluminescence spectroscopy carried out with 633 nm excitation at 77 K indicated that the Raman normalised intensity of the Si-related feature at 737 nm was 4.

f) Photoluminescence spectroscopy carried out with 514 nm excitation at 77 K indicated photoluminescence features at 575, 637 and 737 nm with the following Raman normalised intensities:

| Feature | Raman normalised intensity |
| --- | --- |
| 575 nm | 0.05 |
| 637 nm | 0.03 |
| 737 nm | 6 | g) Photoluminescence spectroscopy carried out with 325 nm excitation at 77 K indicated photoluminescence features at 533 nm and 575 nm.

Characterisation of the cross-sectional slice gave the following results:

a) SIMS measurements again indicated a Si concentration of approximately 6×10$^{15}$ cm$^{-3}$ (34 ppb) for the dominant <100> sector. Significantly higher Si concentrations were measured for minor <100> sectors that had been formed by growth originating at the {100} edge faces of the substrate. In some regions, which optical microscopy indicated were near-colourless, the Si concentration was found to be higher than 10$^{18}$ cm$^{-3}$ (5.7 ppm).

b) Photoluminescence spectra collected at 77 K with 633 nm excitation showed a strong Si-related feature at 737 nm with a Raman normalised intensity of approximately 4 for the dominant <100> sector and rising to almost 40 in the minor <100> sectors.

c) Luminescence images of the CVD material, created with above band gap excitation, were dominated by orange red luminescence.

EXAMPLE 4

Ib HPHT diamond substrates were prepared and mounted onto a tungsten disc as in example 1. This disc was introduced into a microwave plasma CVD reactor and an etch and growth cycle commenced in the general form described in WO 01/96634, but using the following specific synthesis conditions.

The growth conditions were 36/0/600 sccm (standard cubic centimetre per minute) of CH$_4$/Ar/H$_2$ at 250×10$^2$ Pa and a substrate temperature of 810° C., with a silane concentration of 0.25 ppm and nitrogen concentration of 1 ppm. Growth was continued until the thickness of the CVD layers was 0.7 mm. After termination of the growth process the samples were removed and one was processed to produce a free-standing parallel-sided plate of single-crystal CVD diamond. Another was processed to produce a {100} cross-sectional slice. Characterisation of the free-standing CVD plate gave the following results:

a) SIMS measurements carried out in four places on each side of the plate indicated a uniform Si concentration of approximately 5×10$^{15}$ cm$^{-3}$ (28 ppb).

b) UV/visible/NIR absorption spectroscopy measurements carried out at room temperature indicated that the absorption coefficient was less than 0.5 cm$^{-1}$ for all wavelengths between 300 nm and 1000 nm. The absorption coefficient at 270 nm was 0.5 cm$^{-1}$ and, after baseline subtraction, the peak absorption coefficient of the 270 nm feature was 0.074 cm$^{-1}$, indicating a concentration of uncompensated nitrogen of approximately 50 ppb. The absorption coefficients at 350 nm and 520 nm were 0.32 and 0.28 cm$^{-1}$ respectively.

c) The CIELAB chromaticity coordinates for a 0.5 ct round brilliant produced from material of this kind were estimated from the absorption spectroscopy data using the method described earlier and were found to be:

$L^*=84.0, a^*=-0.19, b^*=-0.43, C^*=0.47$

Using the method described earlier, it can be deduced that a stone with these chromaticity coordinates would have an E GIA colour grade.

d) Absorption spectroscopy carried out at 77 K indicated a strong 737 nm feature with an integrated absorption coefficient of 5.41 meV·cm$^{-1}$.

e) Photoluminescence spectroscopy carried out with 633 nm excitation at 77 K indicated that the Raman normalised intensity of the Si-related feature at 737 nm was approximately 0.90.

f) Photoluminescence spectroscopy carried out with 514 nm excitation at 77 K indicated photoluminescence features at 575, 637 and 737 nm with the following Raman normalised intensities:

| Feature | Raman normalised intensity |
| --- | --- |
| 575 nm | 0.022 |
| 637 nm | 0.016 |
| 737 nm | 2 | g) Photoluminescence spectroscopy carried out with 325 nm excitation at 77 K indicated photoluminescence features at 533 nm and 575 nm.

Characterisation of the cross-sectional slice gave the following results:

a) SIMS measurements again indicated a Si concentration of approximately 5×10$^{15}$ cm$^{-3}$ (28 ppb) for the dominant <100> sector. Significantly higher Si concentrations were measured for minor <100> sectors that had been formed by growth originating at the {100} edge faces of the substrate. In some regions, which optical microscopy indicated were near-colourless, the Si concentration was found to be higher than 10$^{18}$ cm$^{-3}$ (5.7 ppm).

b) Photoluminescence spectra collected at 77 K with 633 nm excitation showed a strong Si-related feature at 737 nm with a Raman normalised intensity of approximately 1 for the dominant <100> sector and rising to approximately 4 in the minor <100> sectors.

c) Luminescence images of the CVD material created with above band gap excitation were dominated by orange red luminescence.

EXAMPLE 5

A layered single crystal CVD diamond sample was grown on a {100} HPHT synthetic substrate in six different stages. The gas flow rates were 36/600 sccm (standard cubic centimetres per minute) of $CH_4/H_2$ and the substrate temperature was 810° C. Nitrogen and silane were supplied to give the concentrations in the process gases listed in Table 3 below for the different stages in the growth process. Growth was terminated when the total thickness of CVD growth was 1.4 mm.

A {100} polished cross-sectional slice was processed from the sample to enable the properties of the layers to be studied. When the slice was viewed under an optical transmission microscope the CVD growth was uniformly colourless. Distinct layers corresponding to the different stages of growth could however be clearly distinguished in luminescence images of the slice recorded using above band gap excitation. They were also easily identifiable in cathodoluminescence images recorded using a scanning electron microscope equipped with an Oxford Instruments low magnification cathodoluminescence imaging system. A MonoCL spectrometer was used to measure the intensity of 235 nm free exciton luminescence emitted by each of the layers under electron beam excitation. Table 3 lists the gas phase silicon and nitrogen concentrations, the resulting silicon concentrations measured using SIMS and the free exciton luminescence intensities measured relative to a standard sample of high purity CVD diamond.

TABLE 3

| Layer | Silane (ppm) | Nitrogen (ppm) | Si conc. SIMS (ppm) | N conc SIMS (ppm) | Free exciton CL intensity relative to high purity standard |
|---|---|---|---|---|---|
| 1 | 4.0 | 0 | 0.21 | <0.5 | 1.00 |
| 2 | 3.9 | 2.0 | 0.24 | <0.5 | 1.00 |
| 3 | 3.8 | 3.8 | 0.4 | <0.5 | 0.94 |
| 4 | 3.8 | 5.7 | 0.61 | <0.5 | 0.78 |
| 5 | 3.7 | 7.4 | 0.86 | <0.5 | 0.72 |
| 6 | 4.0 | 10 | 3.75 | <0.5 | 0.34 |

This example demonstrates that the diamond grown can show surprisingly strong free exciton luminescence (measured relative to that shown by a high purity diamond standard) even though it contains significant concentrations of silicon and is grown in the presence of a concentration of nitrogen that would normally cause the material to show very weak free exciton emission. At the highest silicon concentrations, achieved with higher gas phase nitrogen concentrations, the free exciton emission is significantly weaker but the material still has a very low absorption coefficient across the visible region of the spectrum and is therefore colourless. The absorption coefficient spectrum was derived from absorbance measurements (after subtraction of the calculated reflection loss spectrum) and for all positions across the sample the absorption coefficient in the range 350-800 nm was found to be less than 0.9 $cm^{-1}$ and only at 737 nm did it rise above 0.7 $cm^{-1}$.

EXAMPLE 6

A layered single crystal CVD diamond sample was grown on a {100} HPHT synthetic substrate in five different stages. The gas flow rates were 36/600 sccm (standard cubic centimetres per minute) of $CH_4/H_2$ and the substrate temperature was 883° C. Nitrogen and silane were supplied to give the concentrations in the process gases listed in Table 4 below for the different stages in the growth process. Growth was terminated when the total thickness of CVD growth was 1.2 mm.

A {100} polished cross-sectional slice was processed from the sample to enable the properties of the layers to be studied. Distinct layers corresponding to the different stages of growth could be clearly distinguished in luminescence images of the slice recorded using above band gap excitation. They were also easily identifiable in cathodoluminescence images recorded using an SEM equipped with an Oxford Instruments low magnification cathodoluminescence imaging system. A MonoCL spectrometer was used to measure the intensity of 235 nm free exciton luminescence emitted by each of the layers under electron beam excitation. Table 4 lists the gas phase silicon and nitrogen concentrations, the resulting silicon concentrations measured using SIMS and the free exciton luminescence intensities measured relative to a standard sample of high purity CVD diamond.

TABLE 4

| Layer | Silane (ppm) | Nitrogen (ppm) | Si conc. (SIMS) (ppm) | N conc. (SIMS) (ppm) | Free exciton CL intensity relative to high purity standard |
|---|---|---|---|---|---|
| 1 | 0 | 0 | <0.03 | <0.5 | 1.01 |
| 2 | 4 | 0 | 0.73 | <0.5 | 0.63 |
| 3 | 4 | 6 | 1.21 | <0.5 | 0.40 |
| 4 | 4 | 10 | 2.45 | 0.6 | 0.21 |
| 5 | 4 | 14 | 4.36 | 0.7 | 0.23 |

When the slice was viewed under an optical transmission microscope the CVD growth was uniformly colourless except for the final layer which was found to be slightly grey. Absorption spectroscopy at 77 K indicated that, in addition to the well known Si-related line at 737 nm, this final layer also showed absorption lines at approximately 945.3 nm, 830.1 and 856.8 nm and a broad rise in absorption between these lines and approximately 750 nm. The grey appearance results because this higher level of absorption is observed across the whole of the visible spectrum. Absorption coefficient spectra were derived from absorbance measurements (after subtraction of the calculated reflection loss spectrum). For all positions within the first four layers of the sample the absorption coefficient was found to less than 1 $cm^{-1}$ between 350 and 800 nm, only rising above 0.8 $cm^{-1}$ at 737 nm. For the final layer, the absorption coefficient was found to lie between 0.9 $cm^{-1}$ and 2.1 $cm^{-1}$, only rising above 1.5 $cm^{-1}$ at 737 nm.

EXAMPLE 7

A layered single crystal CVD diamond sample was grown on a {100} HPHT synthetic substrate in four different stages. The gas flow rates used were 250/60/4000 sccm of $CH_4$/Ar/$H_2$ and the substrate temperature was 825° C. Table 5 lists the $N_2$ and $B_2H_6$ process gas concentrations supplied for each stage of growth, along with the corresponding concentrations (as measured by SIMS) of atomic nitrogen and boron in each layer of the sample. The total thickness of the CVD material deposited was 1.0 mm.

TABLE 5

| Layer | gas phase N$_2$ (ppm) | gas phase B$_2$H$_6$ (ppm) | mean solid phase nitrogen (ppm) | mean solid phase boron (ppm) |
|---|---|---|---|---|
| 1 | 0 | 0 | Undetectable | <0.1 |
| 2 | 10.4 | 0.029 | 0.3 | 1.3 |
| 3 | 10.4 | 0.019 | 0.3 | 1.0 |
| 4 | 10.4 | 0.008 | 5.0 | 1.5 |

A {100} polished cross-sectional slice was processed from the sample in order for the layers to be studied. FIG. 3 shows a low magnification optical microscopy image of this sample, in which the CVD growth stages are indicated.

The layer corresponding to the first stage of growth was performed under process conditions for high purity CVD diamond growth, and as such this thin initial layer is of high colour. For the subsequent stages of growth the nitrogen level in the gas phase is set at a level which mimics an uncontrolled air leak into the gas system, in which the size of such a leak would introduce sufficient nitrogen to lead to very poor crystalline quality CVD material. FIG. 3 shows that reasonable colour and good crystallinity is maintained in the layers corresponding to the 2$^{nd}$ and 3$^{rd}$ stages of growth, despite the presence of a high concentration of nitrogen in the process gas mixture. This is due to the controlled amounts of diborane added to the process, which ameliorate the negative effects of the nitrogen. In particular, the boron incorporated into the material inhibits excessive surface roughening and subsequent material degradation and in addition provides compensation of the nitrogen donors. In the 4$^{th}$ stage of growth the diborane in the process gas mixture is now below the level at which surface roughening is inhibited and in which the boron incorporated into the material fully compensates nitrogen. Thus the material turns black and the crystalline quality is poor. The measured increase of both the boron and nitrogen concentrations in the material can be explained by the increased surface roughness, which leads to a general increase in impurity uptake.

EXAMPLE 8

A layered single crystal CVD diamond sample was grown on a {100} HPHT synthetic substrate in seven different stages. The gas flow rates used were 250/60/4000 sccm of CH$_4$/Ar/H$_2$ and the substrate temperature was 805° C. Table 6 lists the N$_2$ and B$_2$H$_6$ process gas concentrations supplied for each stage of growth, along with the corresponding concentrations (as measured by SIMS) of atomic nitrogen and boron in each layer of the sample. The total thickness of the CVD material deposited was 1.2 mm.

constant concentration of diborane in the process gas mixture, which may be attributable to small changes in reactor conditions, such as temperature. In each layer of growth the boron incorporation in the material is greater than the nitrogen incorporation, such that full compensation of nitrogen donors is achieved. Thus, similarly to Example 6, the material is able to tolerate relatively high amounts of nitrogen without degrading, as long as full compensation of nitrogen donors is maintained.

Excitonic spectra were measured in each layer of the sample, using an SEM system equipped with an Oxford Instruments cathodoluminescence (CL) system. The spectra were recorded at liquid nitrogen temperature, and from each spectrum the ratio of the boron-bound exciton intensity to the free exciton intensity was calculated. In addition, the free exciton intensity was compared to the free exciton intensity in a standard sample of high purity CVD diamond. The boron-bound exciton intensity correlates to the increasing boron concentration in the material, as expected. In addition, the free-exciton intensity relative to the high purity standard sample decreases as a function of increasing boron incorporation, which is consistent with an increase in the boron bound exciton intensity. It is remarkable that the free-exciton intensity relative to the standard high purity sample is as high as it is, given the levels of nitrogen in the material. For example, for a CVD sample without boron, but with only 0.08 ppm of nitrogen, a free exciton intensity <10% relative to the standard high purity sample has been measured. This is further evidence of the ameliorating effect of boron in the presence of high levels of nitrogen: the effect of boron is to prevent the surface roughening associated with high nitrogen uptake, which inhibits the uptake of other point defects which would ordinarily extinguish the free exciton intensity.

This above-mentioned compensation effect also leads to high colour material, relative to the case in which nitrogen had not been present. In layer 6, of Table 6, in which the gas-phase nitrogen is reduced to 1 ppm, the layer is distinctly visible due to its blue colouration compared to the relatively high colour of layers 5 and 7.

EXAMPLE 9

A 50 mm diameter molybdenum substrate was prepared for the growth of a polycrystalline CVD diamond layer. Prior to commencement of growth, the growth environment was determined to have an uncontrolled nitrogen concentration of 2.5 ppm as measured using gas chromatography. Such a concentration of nitrogen would normally result in a polycrystalline diamond layer of poor quality. An addition of silane, made as 100 ppm silane-in-hydrogen, was made such that the

TABLE 6

| Layer | gas phase N$_2$ (ppm) | gas phase B$_2$H$_6$ (ppm) | mean solid phase nitrogen (ppm) | mean solid phase boron (ppm) | ratio of boron-bound exciton CL intensity to free exciton CL intensity | % free exciton CL intensity relative to high purity standard |
|---|---|---|---|---|---|---|
| 1 | 0 | 0 | 0.11 | 0.13 | 0.06 | 14.96 |
| 2 | 5.2 | 0.037 | 0.18 | 1.19 | 1.03 | 11.00 |
| 3 | 10.4 | 0.037 | 0.61 | 1.51 | 1.28 | 8.42 |
| 4 | 16.6 | 0.037 | 0.98 | 2.28 | 1.6 | 8.96 |
| 5 | 22.8 | 0.037 | 1.25 | 2.7 | 1.91 | 8.08 |
| 6 | 1.0 | 0.037 | 0.2 | 2.87 | 2.26 | 5.82 |
| 7 | 29.1 | 0.037 | 2.6 | 3.89 | 2.24 | 6.54 |

In this example, the boron incorporation in the material increased steadily as a function of growth time, despite a concentration of silicon in the gas phase was approximately 1.5 ppm. Growth was commenced using a plasma-assisted CVD process with a gas composition of $H_2$/Ar/$CH_4$ of 600/10/23 sccm, an addition of 9.5 sccm of 100 ppm $SiH_4$ in $H_2$ (equivalent to ~1.5 ppm silicon in the gas phase), at a temperature of 880° C. and a pressure of $200 \times 10^2$ Pa.

Growth was continued for over 75 hours and a polycrystalline layer was removed with a thickness of approximately 500 μm when measured using a micrometer with pointed anvils. The appearance of the layer was light grey and the crystal quality was judged to be good with no evidence of porosity.

Several 10×10 mm squares were laser cut from the layer and processed so that the optical properties could be measured. The material was transparent at visible wavelengths and had a slight grey colour.

The invention claimed is:

1. A method of forming a CVD diamond, the method comprising:
   (i) providing a substrate;
   (ii) providing a CVD synthesis atmosphere in which there exists a gas comprising nitrogen at a concentration greater than 300 ppb, calculated as molecular nitrogen; and
   (iii) adding into the CVD diamond synthesis atmosphere a gas comprising boron or silicon, wherein the boron or silicon is added in a controlled manner into the CVD diamond synthesis atmosphere to reduce a detrimental effect on color of the single crystal CVD diamond caused by nitrogen so as to produce a single crystal CVD diamond in which a majority volume of at least 80% of the single crystal CVD diamond has at least one of the following features (a) to (e):
   (a) an absorption spectrum measured at room temperature such that the color of a standard 0.5 ct round brilliant would be better than K on the Gemological Institute of American (GIA) gem diamond color scale;
   (b) an absorption coefficient at 270 nm measured at room temperature which is less than 2.9 $cm^{-1}$;
   (c) an absorption coefficient at 350 nm measured at room temperature which is less than 1.5 $cm^{-1}$;
   (d) an absorption coefficient at 520 nm measured at room temperature which is less than 0.45 $cm^{-1}$; and
   (e) an absorption coefficient at 700 nm measured at room temperature which is less than 0.18 $cm^{-1}$,
   wherein the single crystal CVD diamond has a thickness of greater than 0.1 mm, wherein a concentration of nitrogen in the majority volume of the single crystal CVD diamond is greater than $5 \times 10^{15}$ atoms/$cm^3$, and wherein a concentration of boron or silicon in the majority volume of the single crystal CVD diamond is greater than $10^{14}$ atoms/$cm^3$.

2. The method of claim 1, wherein silicon is added into the CVD diamond synthesis atmosphere.

3. The method of claim 2 wherein the concentration of nitrogen in the majority volume of the diamond layer is less than or equal to $2 \times 10^{17}$ atoms/$cm^3$ and the concentration of silicon in the majority volume of the diamond layer is less than or equal to $2 \times 10^{18}$ atoms/$cm^3$.

4. The method of claim 2 wherein the ratio of the concentration of nitrogen to the concentration of silicon in the majority volume of the diamond layer is from 1:20 to 20:1.

5. The method of claim 2 wherein the gas comprising nitrogen is present in the synthesis atmosphere at a concentration of greater than 300 ppb and the gas comprising silicon is present in the synthesis atmosphere at a concentration of greater than 10 ppb.

6. The method of claim 1, wherein boron is added into the CVD diamond synthesis atmosphere.

7. The method of claim 6 wherein the ratio of the concentration of nitrogen to the concentration of boron in the majority volume of the diamond layer is from 1:2 to 2:1.

8. The method of claim 6 wherein the gas comprising nitrogen is present in the synthesis atmosphere at a concentration of greater than 300 ppb and the gas comprising boron is present in the synthesis atmosphere at a concentration of greater than 0.5 ppb.

9. The method of claim 1 wherein the produced CVD diamond layer has an increased normalized free exciton intensity compared to a method where the second gas comprising a second impurity type atom is not added.

10. The method of claim 1 wherein the produced CVD diamond layer has an increase in carrier mobility, carrier lifetime and/or charge collection distance compared to a method where the second gas comprising a second impurity type atom is not added.

11. The method of claim 1 wherein the synthesis atmosphere comprises a concentration of the gas comprising nitrogen which has not been added deliberately of greater than 300 ppb.

12. The method of claim 1 wherein the gas comprising nitrogen is not added in a controlled manner.

13. The method of claim 1 wherein the method comprises one or more of the following features:
   (1) the substrate is a diamond substrate having a surface which is substantially free of crystal defects such that a revealing plasma etch would reveal a density of surface etch features related to defects below $5 \times 10^3$/$mm^2$;
   (2) the duration of the synthesis of the single crystal diamond layer is at least 50 hours; and
   (3) the substrate comprises multiple separated single crystal diamond substrates.

14. The method of claim 1 wherein the CVD diamond layer is a single crystal, and wherein the majority volume of the diamond layer has at least one of the following features:
   a) an absorption spectrum measured at room temperature such that the colour of a standard 0.5 ct round brilliant would be better than K;
   b) an absorption coefficient at 270 nm measured at room temperature which is less than 1.9 $cm^{-1}$;
   c) an absorption coefficient at 350 nm measured at room temperature which is less than 0.90 $cm^{-1}$;
   d) an absorption at 520 nm of less than 0.30 $cm^{-1}$; or
   e) an absorption at 700 nm of less than 0.12 $cm^{-1}$.

15. The method of claim 1 wherein the CVD diamond layer is a single crystal and wherein the diamond layer is formed into a gemstone having three orthogonal dimensions greater than 2 mm, where at least one axis lies either along the <100> crystal direction or along the principle symmetry axis of the gemstone.

16. A CVD diamond layer produced by the method of claim 1.

17. An optical element comprising the CVD diamond layer produced according to the method of claim 1.

18. An electrical or electronic element comprising the CVD diamond layer produced according to the method of claim 1.

19. A CVD diamond layer produced according to the method of claim 1 having a thickness greater than 0.1 mm.

20. A CVD single crystal diamond layer produced according to the method of claim 1 in the form of a gemstone.

21. A CVD single crystal diamond layer according to claim 20 having three orthogonal dimensions greater than 2 mm, wherein at least one axis lies along the <100> crystal direction or along the principle symmetry axis of the gemstone.

22. A CVD single crystal diamond layer according to claim 20 having a clarity of at least SI1 on the GIA gem grading scale.

23. A single crystal CVD diamond layer, wherein a majority volume of at least 80% of the single crystal diamond layer has at least one of the following features (a) to (e):
  (a) an absorption spectrum measured at room temperature such that the color of a standard 0.5 ct round brilliant would be better than K on the Gemological Institute of American (GIA) gem diamond color scale;
  (b) an absorption coefficient at 270 nm measured at room temperature which is less than 2.9 cm$^{-1}$;
  (c) an absorption coefficient at 350 nm measured at room temperature which is less than 1.5 cm$^{-1}$;
  (d) an absorption coefficient at 520 nm measured at room temperature which is less than 0.45 cm$^{-1}$; and
  (e) an absorption coefficient at 700 nm measured at room temperature which is less than 0.18 cm$^{-1}$,
  wherein the single crystal CVD diamond has a thickness of greater than 0.1 mm, wherein a concentration of nitrogen in the majority volume of the single crystal CVD diamond is greater than $5\times10^{15}$ atoms/cm$^3$, and wherein a concentration of boron or silicon in the majority volume of the single crystal CVD diamond is greater than $10^{14}$ atoms/cm$^3$.

24. The CVD diamond layer of claim 23 wherein the majority volume of the diamond layer comprises from $10^{15}$ to $2\times10^{18}$ atoms/cm$^3$ of silicon.

25. The CVD diamond layer of claim 23 wherein silicon is present in the single crystal CVD diamond layer.

26. The CVD diamond layer of claim 23 wherein the layer has a thickness of greater than 1 mm.

27. The CVD diamond layer of claim 23 wherein the layer has a birefringence of less than $1\times10^{-3}$ over a volume greater than 0.1 mm$^3$.

28. The CVD diamond layer of claim 23 wherein the diamond layer is a single crystal.

\* \* \* \* \*